US012765207B2

(12) United States Patent
Lee

(10) Patent No.: US 12,765,207 B2
(45) Date of Patent: Oct. 13, 2026

(54) DISPLAY PANEL AND ELECTRONIC APPARATUS

(71) Applicant: Samsung Display Co., Ltd., Yongin-si (KR)

(72) Inventor: Minsu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 951 days.

(21) Appl. No.: 17/981,333

(22) Filed: Nov. 4, 2022

(65) Prior Publication Data

US 2023/0240109 A1 Jul. 27, 2023

(30) Foreign Application Priority Data

Jan. 26, 2022 (KR) ........................ 10-2022-0011784

(51) Int. Cl.
*H10K 59/00* (2023.01)
*H10D 86/40* (2025.01)
(Continued)

(52) U.S. Cl.
CPC ......... *H10K 59/353* (2023.02); *H10D 86/441* (2025.01); *H10D 86/60* (2025.01);
(Continued)

(58) Field of Classification Search
CPC ............. H10K 59/353; H10K 59/1213; H10K 59/131; H10K 59/40; H10K 59/65;
(Continued)

(56) References Cited

U.S. PATENT DOCUMENTS 10,756,136 B1 * 8/2020 Ma ....................... H10H 29/142
11,263,968 B2 3/2022 Wang et al.
(Continued)

FOREIGN PATENT DOCUMENTS

CN 110678983 A 1/2020
CN 111554196 A 8/2020
(Continued)

OTHER PUBLICATIONS

Srinivasarao et al. “Three-Dimensionally Ordered Array of Air Bubbles in a Polymer Film,” Science 292, 2011, pp. 79-82.
(Continued)

*Primary Examiner* — Samuel Park
(74) *Attorney, Agent, or Firm* — Womble Bond Dickinson (US) LLP

(57) ABSTRACT

A display panel includes: a first display area having a plurality of sub-pixels; and a second display area adjacent to the first display area, wherein the second display area comprises: a pixel portion including at least one sub-pixel; and a plurality of transmissive portions surrounding the pixel portion in a plan view, wherein a sub-pixel circuit including transistors is in the second display area, the transistors being electrically connected to light-emitting diodes that correspond to the at least one sub-pixel, and wherein a portion of a wiring is between two adjacent transmissive portions among the plurality of transmissive portions, the wiring being electrically connected to the sub-pixel circuit.

16 Claims, 19 Drawing Sheets

(51) Int. Cl.

| | |
|---|---|
| ***H10D 86/60*** | (2025.01) |
| ***H10K 59/121*** | (2023.01) |
| ***H10K 59/131*** | (2023.01) |
| ***H10K 59/35*** | (2023.01) |
| ***H10K 59/40*** | (2023.01) |
| ***H10K 59/65*** | (2023.01) |

(52) U.S. Cl.
CPC ....... *H10K 59/1213* (2023.02); *H10K 59/131* (2023.02); *H10K 59/40* (2023.02); *H10K 59/65* (2023.02)

(58) Field of Classification Search
CPC ........... H10K 59/80521; H10K 59/352; H10K 59/121; H10D 86/441; H10D 86/60; H10D 86/40; H10H 29/142; G09G 3/32; G09G 2300/0439; H01L 25/0753
See application file for complete search history.

(56) References Cited

U.S. PATENT DOCUMENTS

| | | | | |
|---|---|---|---|---|
| 2019/0130822 | A1 | 5/2019 | Jung et al. | |
| 2020/0365664 | A1 | 11/2020 | Jeon et al. | |
| 2021/0028244 | A1 | 1/2021 | Jeong et al. | |
| 2021/0134902 | A1 | 5/2021 | Lee et al. | |
| 2021/0184155 | A1 | 6/2021 | Chae et al. | |
| 2021/0405260 | A1 | 12/2021 | He et al. | |
| 2021/0408088 | A1 | 12/2021 | Ban et al. | |
| 2021/0408194 | A1* | 12/2021 | Zhang | H10K 59/126 |
| 2022/0069047 | A1* | 3/2022 | Yang | H10K 59/131 |
| 2022/0199726 | A1* | 6/2022 | Matsueda | H10K 59/131 |

FOREIGN PATENT DOCUMENTS

| | | | |
|---|---|---|---|
| CN | 111725285 | A | 9/2020 |
| CN | 111863924 | A | 10/2020 |
| CN | 112366219 | A | 2/2021 |
| KR | 10-2017-0113066 | A | 10/2017 |
| KR | 10-2020-0087251 | A | 7/2020 |
| KR | 10-2020-0131400 | A | 11/2020 |
| KR | 10-2021-0013493 | A | 2/2021 |
| KR | 10-2021-0074447 | A | 6/2021 |

OTHER PUBLICATIONS

Barnard, et al. "Modulation Transfer Function of Hexagonal Staring Focal Plane Arrays," Optical Engineering 30(12), Dec. 1991, pp. 1915-1919.

* cited by examiner

DISPLAY PANEL AND ELECTRONIC APPARATUS

CROSS-REFERENCE TO RELATED APPLICATION

The present application claims priority to and the benefit of Korean Patent Application No. 10-2022-0011784, filed on Jan. 26, 2022, in the Korean Intellectual Property Office, the entire disclosure of which is incorporated herein by reference.

BACKGROUND

1. Field

Aspects of one or more embodiments relate to a display panel and an electronic apparatus including the same.

2. Description of the Related Art

Recently, the use of display apparatuses has become more diversified. In addition, as display apparatuses have become thinner and lighter, their ranges of use have gradually expanded to more and more applications.

As the area occupied by a display area in display apparatuses expands, various functions that are combined or associated with display apparatuses have been added. As an alternative for adding various functions while expanding a display area, research into a display apparatus having a region for adding various functions, not displaying images, inside the display area has been carried out.

The above information disclosed in this Background section is only for enhancement of understanding of the background and therefore the information discussed in this Background section does not necessarily constitute prior art.

SUMMARY

Aspects of one or more embodiments include a display panel with an extended display area for displaying images even in a region in which a component is arranged, and an electronic apparatus including the display panel. However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to some embodiments, a display panel includes a first display area in which a plurality of sub-pixels are arranged, and a second display area adjacent to the first display area, wherein the second display area includes a pixel portion including at least one sub-pixel, and a plurality of transmissive portions surrounding the pixel portion in a plan view, wherein a sub-pixel circuit including transistors is arranged in the second display area, the transistors being electrically connected to light-emitting diodes that correspond to the at least one sub-pixel, and wherein a portion of a wiring is located between two adjacent transmissive portions among the plurality of transmissive portions, the wiring being electrically connected to the sub-pixel circuit.

According to some embodiments, the wiring may include a data line, a scan line, or a driving voltage line electrically connected to the sub-pixel circuit.

According to some embodiments, each of at least one of the plurality of transmissive portions, or the pixel portion may have a substantially hexagonal shape in a plan view.

According to some embodiments, the display panel may further include a first electrode arranged in the pixel portion in the second display area, an emission layer on the first electrode, and a second electrode on the emission layer, wherein the second electrode may include a plurality of transmissive openings respectively corresponding to the plurality of transmissive portions.

According to some embodiments, the second electrode may include a first portion overlapping the pixel portion, and second portions formed as one body with the first portion and extending in a direction away from the first portion, wherein one of the second portions may be located between two transmissive openings among the plurality of transmissive openings.

According to some embodiments, the plurality of transmissive openings of the second electrode may be located at vertexes of a virtual hexagon centered in the first portion.

According to some embodiments, the display panel may further include a metal layer below the sub-pixel circuit, wherein the metal layer may include a plurality of openings respectively corresponding to the plurality of transmissive portions.

According to some embodiments, the metal layer may include: a first portion overlapping the pixel portion, and second portions formed as one body with the first portion and extending in a direction away from the first portion, wherein a portion of the wiring may overlap one of the second portions of the metal layer.

According to some embodiments, the metal layer may be electrically connected to the wiring, a gate electrode of one of the transistors included in the sub-pixel circuit, or a line, wherein the line is electrically connected to the sub-pixel circuit to apply a signal or a voltage to the sub-pixel circuit.

According to some embodiments of the present disclosure, an electronic apparatus includes: a display panel including a first display area in which a plurality of sub-pixels are arranged, and a second display area adjacent to the first display area, and a component below the display panel and corresponding to the second display area, wherein the second display area of the display panel includes: a pixel portion including at least one sub-pixel, and a plurality of transmissive portions located at vertexes of a virtual N-gon (or polygon with N sides, where N is a multiple of 3) centered located on the pixel portion in a plan view, wherein the at least one sub-pixel emits light from a light-emitting diode electrically connected to the sub-pixel circuit including transistors, and wherein a portion of a wiring electrically connected to the sub-pixel circuit is located between two transmissive portions among the plurality of transmissive portions.

According to some embodiments, the wiring may include a data line, a scan line, or a driving voltage line electrically connected to the sub-pixel circuit.

According to some embodiments, the display panel may further include: a first electrode arranged in the pixel portion in the second display area, an emission layer on the first electrode, and a second electrode on the emission layer, wherein the second electrode may include a plurality of transmissive openings respectively corresponding to the plurality of transmissive portions.

According to some embodiments, the second electrode may include: a first portion overlapping the pixel portion, and second portions formed as one body with the first portion and extending in a radial direction away from a center of the first portion, wherein one of the second portions is located between two adjacent transmissive openings among the plurality of transmissive openings.

According to some embodiments, a center of each of the plurality of transmissive openings of the second electrode may be located in a vertex of a virtual hexagon centered in the first portion.

According to some embodiments, a center of each of the plurality of transmissive openings of the second electrode may be located in a vertex of a virtual triangle centered in the first portion.

According to some embodiments, a portion of the wiring may overlap one of the second portions of the second electrode.

According to some embodiments, the display panel may further include a metal layer below the sub-pixel circuit, wherein the metal layer may include a plurality of openings respectively corresponding to the plurality of transmissive portions.

According to some embodiments, the metal layer may include: a first portion overlapping the pixel portion, and second portions formed as one body with the first portion and extending in a direction away from the first portion, wherein a portion of the wiring may overlap one of the second portions of the metal layer.

According to some embodiments, the metal layer may be electrically connected to the wiring, a gate electrode of one of the transistors included in the sub-pixel circuit, or a line, wherein the line is electrically connected to the sub-pixel circuit to apply a signal or a voltage to the sub-pixel circuit.

According to some embodiments, the component may include a sensor or a camera.

These and/or other aspects will become apparent and more readily appreciated from the following detailed description of the embodiments, the accompanying drawings, and the claims and their equivalents.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
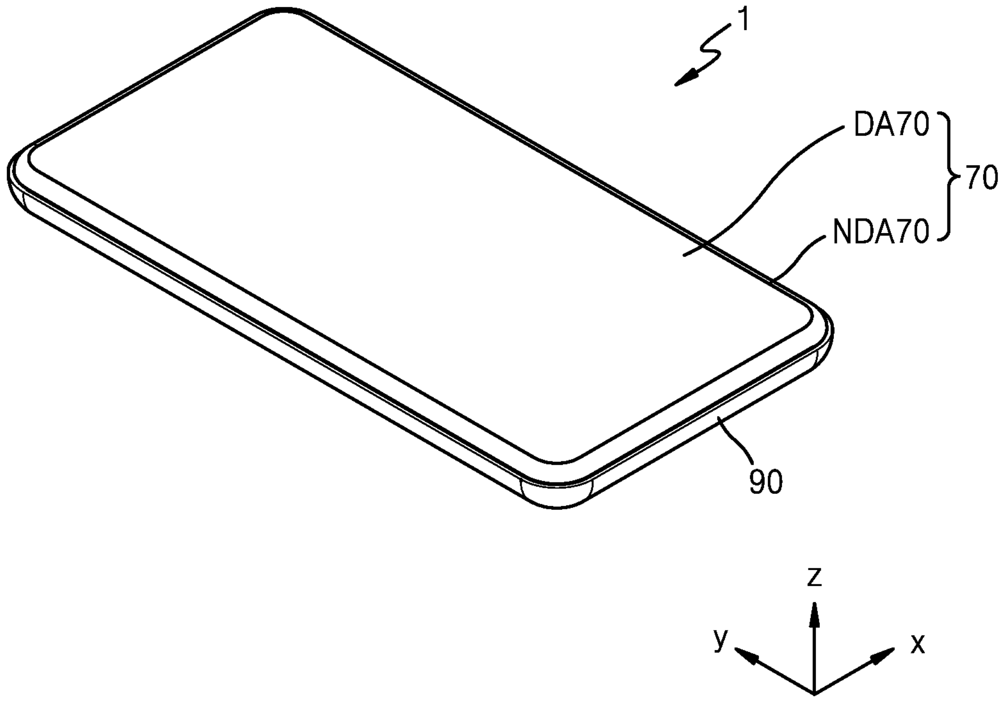
FIG. 1 is a perspective view of an electronic apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any suitable variations or combinations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the case where certain embodiments may be implemented differently, a specific process order may be performed in the order different from the described order. As an example, two processes successively described may be simultaneously performed substantially and performed in the opposite order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2:
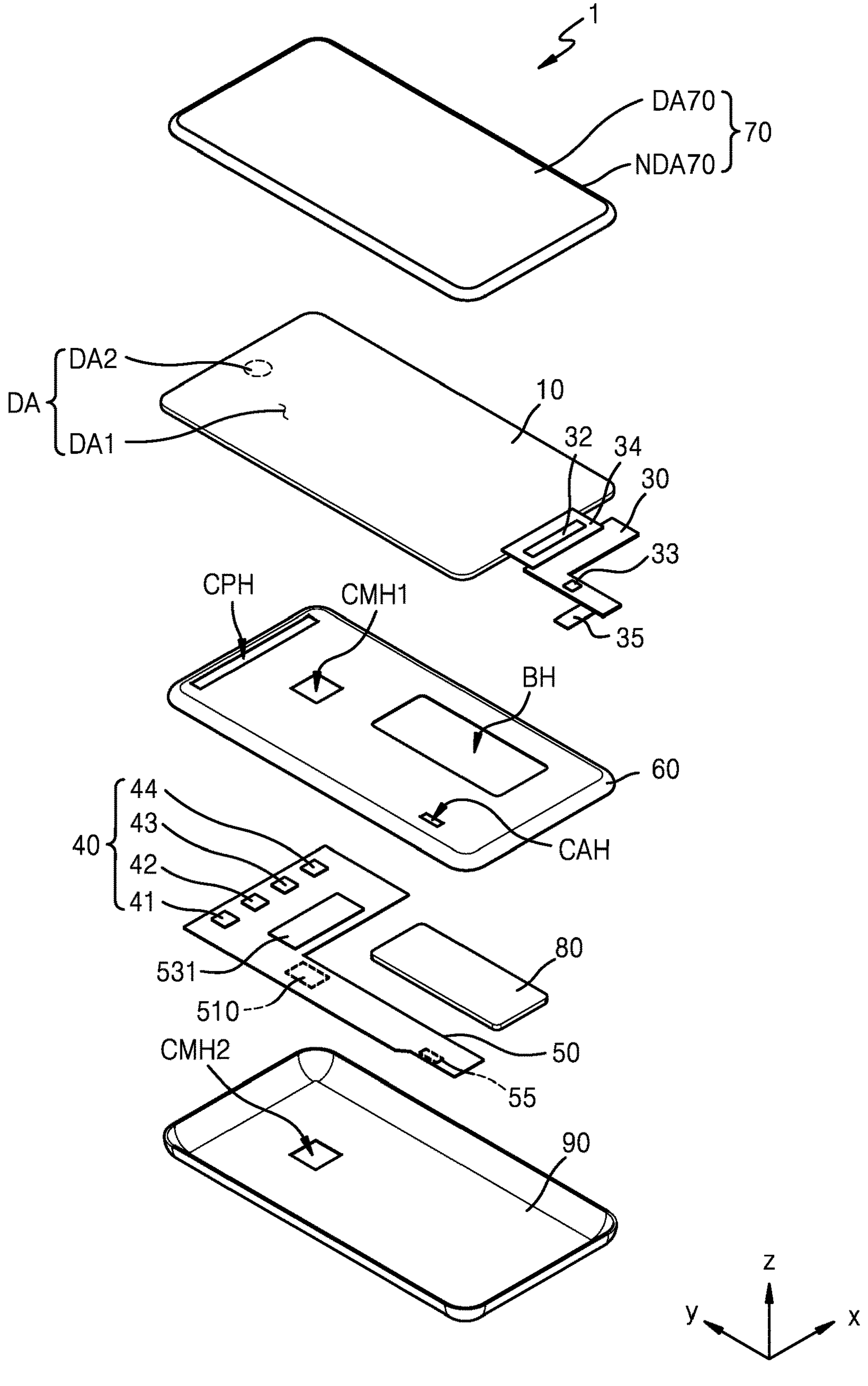
FIG. 2 is an exploded perspective view of an electronic apparatus according to some embodiments.
Figure 3:
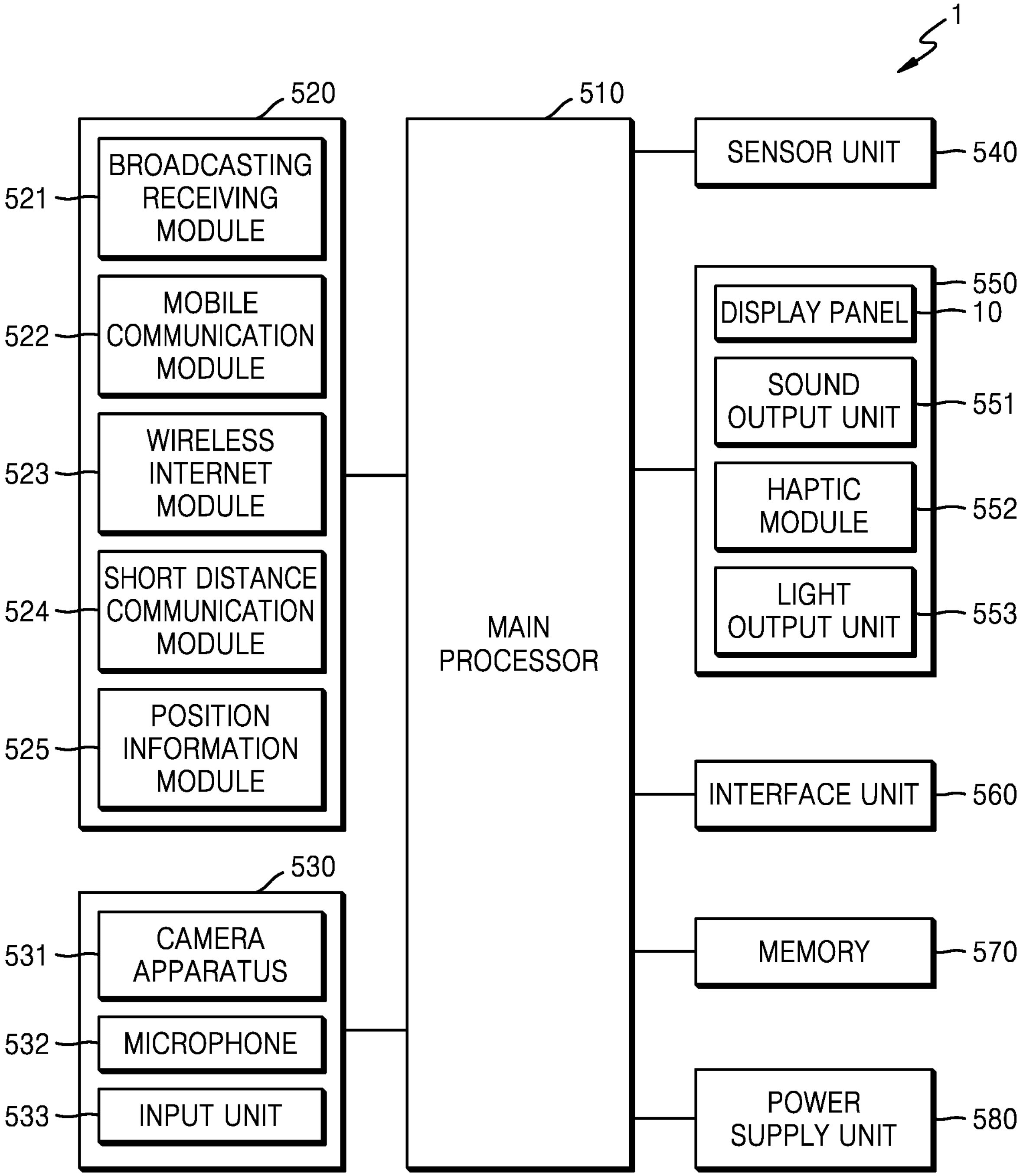
FIG. 3 is a block diagram of an electronic apparatus according to some embodiments.

FIG. 1 is a perspective view of an electronic apparatus 1 according to some embodiments, and FIG. 2 is an exploded perspective view of the electronic apparatus 1 according to some embodiments. FIG. 3 is a block diagram of the electronic apparatus 1 according to some embodiments.

Referring to FIGS. 1 and 2, the electronic apparatus 1 is an apparatus for displaying moving images or still (e.g., static) images, and may be used as a display screen of various products including televisions, notebook computers, monitors, advertisement boards, Internet of things (IoT) as well as portable electronic apparatuses including mobile phones, smart phones, tablet personal computers (PC), mobile communication terminals, electronic organizers, electronic books, portable multimedia players (PMP), navigations, and ultra mobile personal computers (UMPC). In addition, the electronic apparatus 1 may be used in wearable devices including smartwatches, watchphones, glasses-type displays, and head-mounted displays (HMD). In addition, according to some embodiments, the electronic apparatus 1 may be used as or incorporated into instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

For convenience of description, it is shown in FIGS. 1 and 2 that the electronic apparatus 1 according to some embodiments is used as a smartphone. The electronic apparatus 1 according to some embodiments may include a cover window 70, a display panel 10, a display circuit board 30, a display driver 32, a touch sensor driver 33, a bracket 60, a main circuit board 50, a battery 80, and a lower cover 90.

In a plan view of the present specification, "left," "right," "up," and "down" denote directions when the display panel 10 is viewed in a direction perpendicular to the display panel 10. As an example, "left" denotes a −x direction, "right" denotes a +x direction, "up" denotes a +y direction, and "down" denotes a −y direction.

The electronic apparatus 1 may have a rectangular shape in a plan view. As an example, as shown in FIG. 1, the electronic apparatus 1 may have a quadrangular shape having short sides in the x direction and long sides in the y direction in a plan view. A corner where the short side in the x direction meets the long side in the y direction, may be round to have a preset curvature or formed to have a right angle. A planar shape of the electronic apparatus 1 is not limited to a rectangle, but may be other polygons, ellipses, or irregular shapes.

The cover window 70 may be arranged on the display panel 10 to cover the upper surface of the display panel 10. Accordingly, the cover window 70 may protect the upper surface of the display panel 10.

The cover window 70 may include a transmissive cover portion DA70 and a light-blocking cover portion NDA70, wherein the transmissive cover portion DA70 corresponds to the display panel 10, and the light-blocking cover portion NDA70 corresponds to a region other than the display panel 10 (e.g., a bezel area or periphery of the transmissive cover portion DA70). The light-blocking cover portion NDA70 may include an opaque material (e.g., a colored opaque material) that blocks light. The light-blocking cover portion NDA70 may include a pattern that may be viewed to a user while images are not displayed.

The display panel 10 may be arranged under the cover window 70. The display panel 10 may overlap the transmissive cover portion DA70 of the cover window 70.

The display panel 10 may include a display area DA, and the display area DA may include a first display area DA1 and a second display area DA2. Both the first display area DA1 and the second display area DA2 are regions in which images are displayed. The second display area DA2 may be a region below which a component 40 such as a sensor and a camera that use visible light, infrared, sound, or the like is located. According to some embodiments, the second display area DA2 may be a region having a higher light transmittance and/or sound transmittance than the first display area DA1. According to some embodiments, in the case where light passes through the second display area DA2, a light transmittance may be 25% or more, 30% or more, or, for example, (or more preferably) 50% or more, 75% or more, 80% or more, 85% or more, or 90% or more.

The display panel 10 may be a light-emitting display panel including a light-emitting diode. The light-emitting diode may include an organic light-emitting diode including an organic emission layer. According to some embodiments, the light-emitting diode may be an inorganic light-emitting diode including an inorganic material. The inorganic light-emitting diode may include a PN diode including inorganic material semiconductor-based materials. When a forward voltage is applied to a PN-junction diode, holes and electrons are injected and energy created by recombination of the holes and the electrons is converted to light energy, and thus, light of a preset or predetermined color may be emitted according to a data signal. The inorganic light-emitting diode may have a width in the range of several micrometers to hundreds of micrometers. According to some embodiments, the inorganic light-emitting diode may be denoted by a micro light-emitting diode.

The display panel 10 may be a rigid display panel that has rigidity and thus is not easily bent, or a flexible display panel that has flexibility and thus is easily bendable, foldable, or rollable. As an example, the display panel 10 may include a foldable display panel that is foldable and unfoldable, a curved display panel that has a curved display surface, a bendable display panel in which a region except a display surface is bent, a rollable display panel that is rollable and unrollable, and a stretchable display panel that is stretchable.

The display panel 10 may be implemented transparent and be a transparent display panel such that an object or background located below the display panel 10 is viewable from the upper surface of the display panel 10. Alternatively, the display panel 10 may be a reflective display panel that may reflect an object or background over the upper surface of the display panel 10.

A first flexible film 34 may be attached to the edge of one side of the display panel 10. One side of the first flexible film 34 may be attached to the edge of one side of the display panel 10 by using an anisotropic conductive film. The first flexible film 34 may be a flexible film that is bendable.

The display driver 32 may be located on the first flexible film 34. The display driver 32 may receive control signals and power voltages, generate and output signals and voltages for driving the display panel 10. The display driver 32 may include an integrated circuit (IC).

The display circuit board 30 may be attached to another side of the first flexible film 34. Another side of the first flexible film 34 may be attached to the upper surface of the display circuit board 30 by using an anisotropic conductive film. The display circuit board 30 may be a flexible printed circuit board (FPCB) that may be bent, a rigid printed circuit board (PCB) that is strong and not easily bent, or a composite printed circuit board including both a rigid printed circuit board and a flexible printed circuit board.

A touch sensor driver 33 may be located on the display circuit board 30. The touch sensor driver 33 may include an integrated circuit. The touch sensor driver 33 may be attached to the display circuit board 30. The touch sensor driver 33 may be electrically connected to touch electrodes of a touchscreen layer of the display panel 10 through the display circuit board 30.

The touchscreen layer of the display panel 10 may sense a user's touch input by using at least one of various touch methods such as a resistance layer method, a capacitance method, or the like. As an example, in the case where the touchscreen layer of the display panel 10 senses a user's touch input by using a capacitance method, the touch sensor driver 33 may determine whether a user touches the touchscreen layer by applying driving signals to driving electrodes among touch electrodes, and sensing voltages charged in mutual capacitances between the driving electrodes and the sensing electrodes through the sensing electrodes among the touch electrodes.

A user's touch may include a contact touch and a proximity touch. A contact touch refers to a situation in which an object such as a user's finger or a pen directly contacting the cover window 70 located on the touchscreen layer. A proximity touch, like hovering, refers to a situation in which an object such as a user's finger or a pen is located near over the cover window 70, away from the cover window 70. The touch sensor driver 33 may be configured to transfer sensor data to a main processor 510 according to sensed voltages, and the main processor 510 may be configured to calculate touch coordinates at which a touch input occurs by analyzing the sensor data.

A power supply unit may be additionally located on the display circuit board 30, wherein the power supply unit is configured to supply driving voltages for driving the subpixels of the display panel 10, the scan driver, and the display driver 32. Alternatively, the power supply unit may be integrated with the display driver 32. In this case, the display driver 32 and the power supply unit may be implemented in one integrated circuit.

A bracket 60 for supporting the display panel 10 may be located under the display panel 10. The bracket 60 may include plastic, metal, or both plastic and metal. A first camera hole CMH1 in which a camera apparatus 40 (531) is inserted, a battery hole BH in which a battery 80 is located, and a cable hole CAH through which a cable 35 connected to the display circuit board 30 passes, may be formed in the bracket 60. In addition, a component hole CPH may be provided in the bracket 60, wherein the component hole CPH overlaps the second display area DA2 of the display panel 10. The component hole CPH may overlap components 40 of the main circuit board 50 in a third direction (a z direction). Accordingly, the second display area DA2 of the display panel 10 may overlap the components 40 of the main circuit board 50 in the third direction (the z direction). In addition, the component hole CPH may not be formed in the bracket 60. In this case, the bracket 60 may be arranged not to overlap the second display area DA2 of the display panel 10 in the third direction (the z direction).

The component 40 may overlap the second display area DA2 of the display panel 10. As an example, the component 40 may include first to fourth components 41, 42, 43, and 44 each overlapping the second display area DA2. The first to fourth components 41, 42, 43, and 44 may include a proximity sensor, an illuminance sensor, an iris sensor, a face recognition sensor, and a camera (or an image sensor). Because the second display area DA2 of the display panel 10 has a preset light transmittance, a proximity sensor that uses an infrared ray may detect an object arranged close to the upper surface of the electronic apparatus 1, and an illuminance sensor may sense brightness of light incident to the upper surface of the electronic apparatus 1. In addition, an iris sensor may photograph a person's iris arranged over the upper surface of the electronic apparatus 1, and a camera may photograph an object arranged over an upper surface of the electronic apparatus 1. The component 40 overlapping the second display area DA2 of the display panel 10 is not limited to a proximity sensor, an illuminance sensor, an iris sensor, a face recognition sensor, and a camera, and various sensors described below may be utilized as the component 40.

The main circuit board 50 and the battery 80 may be located under the bracket 60. The main circuit board 50 may be a printed circuit board or a flexible printed circuit board.

The main circuit board 50 may include the main processor 510, the camera apparatus 531, a main connector 55, and the components 40. The main processor 510 may include an integrated circuit. The camera apparatus 531 may be located on both the upper surface and the lower surface of the main circuit board 50, and the main processor 510 and the main connector 55 may each be located on one of the upper surface and the lower surface of the main circuit board 50.

The main processor 510 may be configured to control all functions of the electronic apparatus 1. As an example, the main processor 510 may be configured to output digital video data to the display driver 32 through the display circuit board 30 such that the display panel 10 displays images. In addition, the main processor 510 may be configured to receive sensed data from the touch sensor driver 33. The main processor 510 may determine whether a user directly touches the touchscreen according to sensed data, and execute an operation corresponding to a user's direct touch or proximity touch. As an example, the main processor 510 may analyze sensed data and calculate a user's touch coordinates, and then execute an application indicated by an icon the user touches, or perform an operation. The main processor 510 may be an application processor including an integrated circuit, a central processing unit, or a system chip.

The camera apparatus 531 processes image frames such as still images or moving images obtained by an image sensor in a camera mode, and outputs the image frames to the main processor 510. The camera apparatus 531 may include at least one of a camera sensor (e.g., a charge-coupled device (CCD), a complementary metal oxide semiconductor (CMOS), and the like), a photo sensor (or an image sensor), or a laser sensor. The camera apparatus 531 may be connected to an image sensor among the components 40 overlapping the second display area DA2 and may process images input to the image sensor.

The cable 35 passing through the cable hole CAH of the bracket 60 may be connected to the main connector 55, and thus, the main circuit board 50 may be electrically connected to the display circuit board 30.

The main circuit board 50 may further include at least one of elements of a wireless communication unit 520, at least one of elements of an input unit 530, at least one of elements of a sensor unit 540, at least one of elements of an output unit 550, at least one of elements of an interface unit 560, a memory 570, or a power supply unit 580 in addition to the main processor 510, the camera apparatus 531, and/or the main connector 55.

The wireless communication unit 520 may include at least one of a broadcasting receiving module 521, a mobile communication module 522, a wireless Internet module 523, a short distance communication module 524, or a position information module 525.

The broadcasting receiving module 521 is configured to receive broadcasting signals and/or broadcasting-related information from an external broadcasting management server through a broadcasting channel. The broadcasting channel may include satellite channels, groundwave channels.

The mobile communication module 522 is configured to transmit/receive radio signals to/from at least one of a base station, an external terminal, or a server on a mobile communication network established according to technology standards for mobile communication or communication schemes (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), and the like). Wireless signals may include voice call signals, image communication call signals, or various types of data corresponding to text/multimedia message transmission/reception.

The wireless Internet module 523 refers to a module for wireless Internet access. The wireless Internet module 523 may be configured to transmit/receive radio signals on a communication network according to wireless Internet technologies. Examples of wireless Internet technologies include wireless local area network (WLAN), wireless-fidelity (Wi-Fi), Wi-Fi Direct, and digital living network alliance (DLNA).

The short distance communication module 524 is for short range communication, and may support short distance communication by using at least one of Bluetooth, Radio Frequency Identification (RFID), Infrared Data Association; IrDA (IrDA), Ultra Wideband (UWB), ZigBee, Near Field Communication (NFC), Wi-Fi, Wi-Fi Direct, or Wireless Universal Serial Bus (Wireless USB) technologies. The short distance communication module 524 may support wireless communication between the electronic apparatus 1 and a wireless communication system, between the electronic apparatus 1 and another the electronic apparatus, or between the electronic apparatus 1 and a network in which another the electronic apparatus (or an external server) is located, through a short distance wireless area network. The short distance wireless area network may be a wireless personal area network. The other electronic apparatus may be a wearable device that may exchange data, or cooperate with the electronic apparatus 1.

The position information module 525 is a module for obtaining the position (or the current position) of the electronic apparatus 1. Representative examples of the position information module 525 include a Global Positioning System (GPS) module or a Wi-Fi module. As an example, when the GPS module is utilized, the electronic apparatus 1 may obtain the position of the electronic apparatus 1 by using signals sent by GPS satellites. In addition, the electronic apparatus 1 may obtain the position of the electronic apparatus 1 based on information of a wireless access point (AP) that transmits/receives radio signals to/from the Wi-Fi module by using the Wi-Fi module. The position information module 525 is a module for obtaining the position (or the current position) of the electronic apparatus 1. The position information module 525 is not limited to a module for directly calculating or obtaining the position of the electronic apparatus 1.

The input unit 530 may include an image input unit such as the camera apparatus 531 for inputting image signals, a sound input unit such as a microphone for inputting sound signals, and the input device 533 for receiving information from a user.

The camera apparatus 531 processes image frames such as still images or moving images obtained by an image sensor in an image communication mode or a photographing mode. The processed image frames may be displayed on the display panel 10 or stored in the memory 570.

The microphone 532 processes external sound signals as electrical voice data. The processed voice data may be variously utilized according to a function (or an application in execution) being performed in the electronic apparatus 1. Various noise cancelling algorithms may be implemented in the microphone 532, wherein the various noise cancelling algorithms cancel noises occurring during a process of receiving external sound signals.

The main processor 510 may control an operation of the electronic apparatus 1 to correspond to information input through the input device 533. The input device 533 may include a mechanical input means such as buttons, a dome switch, a jog wheel, a jog switch, and the like, or a touch input means located on the lower surface or the lateral surface of the electronic apparatus 1. The touch input means may include the touchscreen layer of the display panel 10.

The sensor unit 540 may include at least one sensor that senses at least one of information inside the electronic apparatus 1, peripheral environmental information surrounding the electronic apparatus 1, or user information, and generates sensing signals corresponding thereto. The main processor 510 may control driving or an operation of the electronic apparatus 1 based on the sensing signals, or perform data processing, a function, or an operation related to an application installed in the electronic apparatus 1. The sensor unit 540 may include at least one of a proximity sensor, an illumination sensor, an acceleration sensor, a magnetic sensor, a G-sensor, a gyroscope sensor, a motion sensor, an RGB sensor, an infrared sensor, a finger scan sensor, an ultrasonic sensor, an optical sensor, a battery gauge, an environment sensor (e.g., a barometer, a hygrometer, a thermometer, a radiation detection sensor, a heat detection sensor, a gas detection sensor, and the like), or a chemical sensor (e.g., an electronic nose, a healthcare sensor, a biometric sensor, and the like).

A proximity sensor refers to a sensor that detects whether there is an object approaching a preset detection surface or an object existing in the neighborhood by using electromagnetic force, an infrared ray, or the like without a mechanical contact. Examples of the proximity sensor include a transmissive photo-electric sensor, a direct reflective photo-electric sensor, a mirror reflective photo-electric sensor, a high-frequency oscillation type proximity sensor, a capacitance type proximity sensor, a magnetic proximity sensor, and an infrared proximity sensor. The proximity sensor may sense not only a proximity touch, but also a proximity touch pattern such as a proximity touch distance, a proximity touch direction, a proximity touch velocity, a proximity touch time, a proximity touch position, and a proximity touch movement state. The main processor 510 may process data (or information) corresponding to a proximity touch operation and a proximity touch pattern sensed by the proximity sensor, and control the display panel 10 to display visual information corresponding to the processed data.

The ultrasonic sensor may recognize the position information of an object by using ultrasonic waves. The main processor 510 may calculate the position of an object by using information sensed by an optical sensor and a plurality of ultrasonic sensors. Because the velocity of light is different from the velocity of ultrasonic waves, the position of an object may be calculated by using a time during which light reaches a light sensor and a time during which ultrasonic waves reach the ultrasonic sensor.

The output unit 550 is for generating an output related to a visual sense, an auditory sense, or a tactile sense, and may include at least one of the display panel 10, a sound output unit 551, a haptic module 552, or a light output unit 553.

The display panel 10 displays (outputs) information processed by the electronic apparatus 1. As an example, the display panel 10 may display execution screen information of an application driven in the electronic apparatus 1, or user interface (UI) and graphic user interface (GUI) information corresponding to execution screen information. The display panel 10 may include a display layer and the touchscreen layer, wherein the display layer displays images, and the touchscreen layer senses a user's touch input. Accordingly, the display panel 10 may serve as one of the input devices 533 that provides an input interface between the electronic apparatus 1 and a user, and simultaneously, serve as one of elements of the output unit 550 that provides an output interface between the electronic apparatus 1 and a user.

The sound output unit 551 may output sound data received by the wireless communication unit 520 or stored in the memory 570 in a call reception mode, a communication mode or recoding mode, a voice recognition mode, a broadcasting reception mode, and the like. The sound output unit 551 may output sound signals related to a function (e.g., a call signal reception tone, a message reception tone, and the like) performed by the electronic apparatus 1. The sound output unit 551 may include a receiver and a speaker. At least one of the receiver or the speaker may be a sound generator that is attached under the display panel 10 and vibrates the display panel 10 to output sounds. The sound generator may be a piezoelectric element or a piezoelectric actuator that contacts and expands according to electrical signals, or an exciter that generates magnetic force by using a voice coil to vibrate the display panel 10.

The haptic module 552 generates various haptic effects that may be felt by a user. The haptic module 552 may provide vibrations to a user as a haptic effect. The intensity, the pattern, and the like of vibrations generated by the haptic module 552 may be controlled by a user's selection or setting of the main processor 510. As an example, the haptic module 552 may synthesize different vibrations to output the same, or sequentially output the different vibrations. The haptic module 552 may generate various tactile effects such as effects due to the arrangement of pins that move perpendicular to the surface of a skin in contact, the blowing force or suction power of air through a nozzle or a suction port, sweep to the skin surface, an electrode contact, stimulus of electrostatic force, and effects due to reproduction of cool and warm feeling using elements that may absorb heat or generate heat, as well as vibrations. The haptic module 552 may not only transfer a tactile effect through a direct contact but implement a tactile effect such that a user may feel the tactile effect through a muscle sense in fingers or arms.

The light output unit 553 outputs signals for informing occurrence of an event by using light of a light source. Examples of an event generated in the electronic apparatus 1 may include message reception, call signal reception, a missed call, alarm, schedule notification, e-mail reception, information reception through an application, and the like. Signals output by the light output unit 553 are implemented when the electronic apparatus 1 emits light of a single color or a plurality of colors to the front surface or the rear surface. The signal output may end when the electronic apparatus 1 detects that a user confirms an event.

The interface unit 560 serves as a path with various kinds of external apparatuses connected to the electronic apparatus 1. The interface unit 560 may include at least one of a wired/wireless headset port, an external charger port, a wired/wireless data port, a memory card part, a port for connecting an apparatus having an identification module, an audio input/output (I/O) port, a video I/O port, or an earphone port. When an external apparatus is connected to the interface unit 560, the electronic apparatus 1 may perform an appropriate control related to the external apparatus connected.

The memory 570 stores data that support various functions of the electronic apparatus 1. The memory 570 may store data for a plurality of application programs driven in the electronic apparatus 1, and operations of the electronic apparatus 1, and commands. At least some of the plurality of application programs may be downloaded from an external server through wireless communication. The memory 570 may store an application program for operations of the main processor 510, and temporarily store data input/output, for example, data such as a phone book, messages, still images, moving images, and the like. In addition, the memory 570 may store haptic data for various patterns of vibrations provided to the haptic module 552, and sound data regarding various sounds provided to the sound output unit 551. The memory 570 may include at least one type of storing medium among a flash memory type, a hard disk type, a solid state disk (SSD) type, a silicon disk drive (SDD) type, a multimedia card micro type, a card type memory (e.g., secure digital (SD) or extreme digital (XD) memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

The power supply unit 580 receives an external power and an internal power under control of the main processor 510, and supplies power to respective elements included in the electronic apparatus 1. The power supply unit 580 may include the battery 80. In addition, the power supply unit 580 may include a connection port. The connection port may be configured as an example of the interface unit 560 to which an external charger is electrically connected, wherein the external charger supplies power to charge the battery 80. Alternatively, the power supply unit 580 may be configured to charge the battery 80 wirelessly, inductively, or magnetically without using the connection port. The battery 80 may receive power from an external wireless power transfer apparatus by using at least one of inductive coupling or magnetic resonance coupling, wherein the inductive coupling is based on magnetic induction, and the magnetic resonance coupling is based on electromagnetic resonance. The battery 80 may be arranged not to overlap the main circuit board 50 in the third direction (the z direction). The battery 80 may overlap a battery hole BH of the bracket 60.

The lower cover 90 may be located under the main circuit board 50 and the battery 80. The lower cover 90 may be fastened and fixed to the bracket 60. The lower cover 90 may form the lower appearance of the electronic apparatus 1. The lower cover 90 may include plastic, metal, or both plastic and metal.

A second camera hole CMH2 through which the lower surface of the camera apparatus 531 is exposed may be formed in the lower cover 90. The position of the camera apparatus 531 and the first and second camera holes CMH1 and CMH2 corresponding to the camera apparatus 531 are not limited to the embodiments shown with respect to FIGS. 1 and 2, but may be variously modified.

Figure 4:
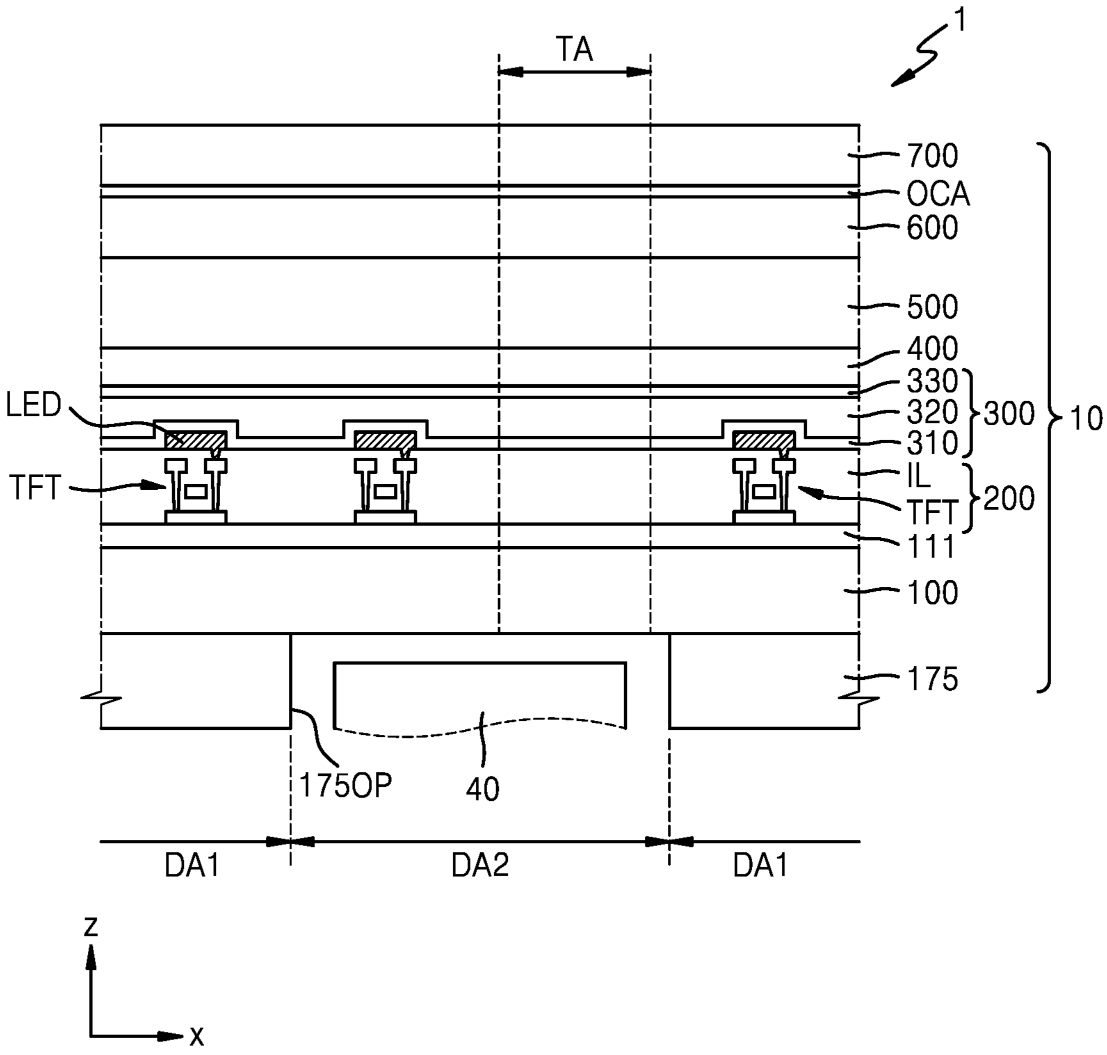
FIG. 4 is a cross-sectional view of an electronic apparatus according to some embodiments.

FIG. 4 is a cross-sectional view of the electronic apparatus 1 according to some embodiments.

Referring to FIG. 4, the electronic apparatus 1 may include the display panel 10 and the component 40 located below the display panel 10.

The display panel 10 may include a substrate 100, a display layer 200, an encapsulation layer 300, an input sensing layer 400, an optical functional layer 500, and an anti-reflection layer 600. A window 700 may be arranged over the anti-reflection layer 600 by using an adhesive layer such as an adhesive OCA.

The substrate 100 may include glass, metal, or a polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin is flexible, rollable, or bendable. The substrate 100 may have a multi-layered structure including a layer that includes the polymer resin and an inorganic layer.

The display layer 200 may be located on the front surface of the substrate 100, and a lower protective film 175 may be located on the lower surface of the substrate 100. The lower protective film 175 may be attached to the rear surface of the substrate 100. An adhesive layer may be located between the lower protective film 175 and the substrate 100. Alternatively, the lower protective film 175 may be directly formed on the rear surface of the substrate 100. In this case, an adhesive layer may not be located between the lower protective film 175 and the substrate 100.

The lower protective film 175 may support and protect the substrate 100. The lower protective film 175 may include a first opening 175OP corresponding to the second display area DA2. The first opening 175OP of the lower protective film 175 is an indented portion formed while a portion of the lower protective film 175 is removed in a thickness direction. According to some embodiments, the first opening 175OP of the lower protective film 175 is formed while a portion of the lower protective film 175 is removed entirely in the thickness direction.

Because the lower protective film 175 includes the first opening 175OP, a transmittance of the second display area DA2, for example, a light transmittance of a transmissive portion TA may be improved. The lower protective film 175 may include an organic insulating material such as polyethyleneterephthalate (PET) or polyimide (PI).

The display layer 200 may include a plurality of sub-pixels. Each sub-pixel may include a display element, and the display element may emit red, green, or blue light. The display element may include a light-emitting diode LED. The light-emitting diode LED may include an organic light-emitting diode or an inorganic light-emitting diode (a micro light-emitting diode).

The display layer 200 may include a display element layer, a circuit layer, a buffer layer 111, and an insulating layer IL, wherein the display element layer includes a light-emitting diode LED, which is a display element, the circuit layer includes a thin-film transistor TFT electrically connected to the light-emitting diode LED, the buffer layer 111 is between the substrate 100 and the circuit layer, and the insulating layer IL is between the display element layer and the circuit layer. The thin-film transistor TFT, and the light-emitting diode LED electrically connected to the thin-film transistor TFT may be arranged in each of the first display area DA1 and the second display area DA2.

The second display area DA2 may include at least one transmissive portion TA in which the thin-film transistor TFT and the light-emitting diode LED are not arranged. Light emitted from the component 40 and/or light directed to the component 40 may pass through the transmissive portion TA.

The display layer 200 may be sealed by an encapsulation member. According to some embodiments, the encapsulation member may include the encapsulation layer 300 as shown in FIG. 4. The encapsulation layer 300 may include at least one inorganic encapsulation layer and at least one organic encapsulation layer. According to some embodiments, the encapsulation layer 300 may include a first inorganic encapsulation layer 310, a second inorganic encapsulation layer 330, and an organic encapsulation layer 320 therebetween.

The input sensing layer 400 may obtain coordinate information corresponding to an external input, for example, a touch event of a finger or an object such as a stylus pen. The input sensing layer 400 may include a touch electrode and touch lines connected to the touch electrode. The input sensing layer 400 may sense an external input by using a self-capacitance method and/or a mutual capacitance method.

The optical functional layer 500 may improve a light efficiency. As an example, a front light efficiency and/or a lateral visibility of light emitted from the light-emitting diode LED may be improved.

The anti-reflection layer 600 may reduce reflectivity of light (external light) incident toward the display panel 10 from the outside. According to some embodiments, the anti-reflection layer 600 may include an optical plate including a retarder and/or a polarizer. The anti-reflection layer 600 may include an opening overlapping the transmissive portion TA.

According to some embodiments, the anti-reflection layer 600 may include a filter plate including a black matrix and color filters. The filter plate may include color filters arranged for each sub-pixel and a black matrix surrounding the color filters.

According to some embodiments, the anti-reflection layer 600 may include a destructive interference structure. The destructive interference structure may include a first reflection layer and a second reflection layer respectively arranged on different layers. First-reflected light and second-reflected light respectively reflected by the first reflection layer and the second reflection layer may destructively interfere and thus the reflectivity of external light may be reduced.

The window 700 may be located on the anti-reflection layer 600 and coupled to the anti-reflection layer 600 through an adhesive layer such as an optically clear adhesive layer OCA.

Figure 5:
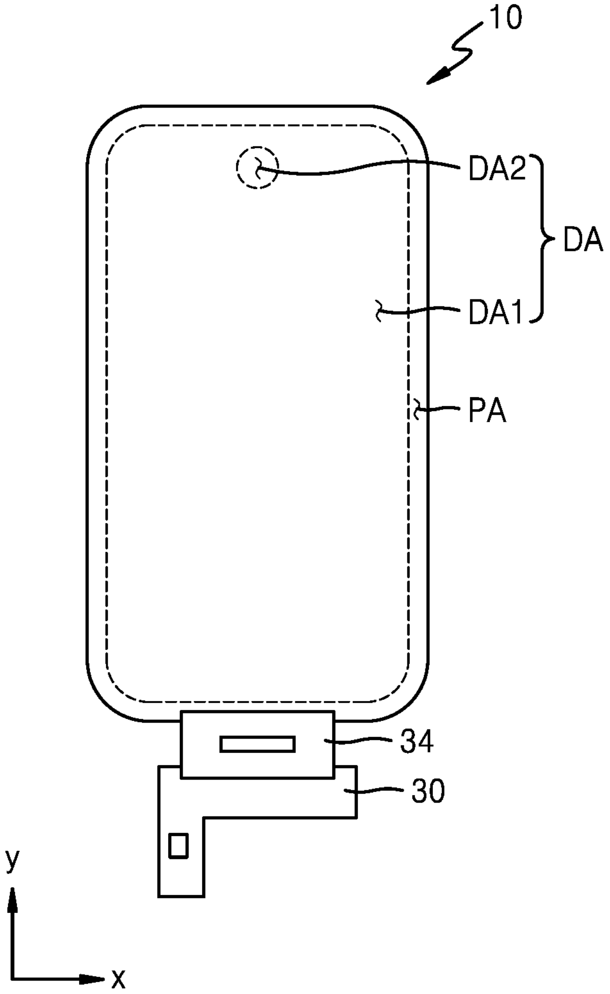
FIG. 5 is a schematic plan view of a display panel according to some embodiments.

FIG. 5 is a schematic plan view of the display panel 10 according to some embodiments.

Referring to FIG. 5, the display area DA may be surrounded by a peripheral area PA entirely. A pad portion may be arranged in the peripheral area PA. As shown in FIG. 5, the display circuit board 30 may be electrically connected to the pad portion in the peripheral area PA through a first flexible film 34 in the peripheral area PA.

The display area DA may include the first display area DA1 and the second display area DA2. As described above with reference to FIG. 4, the second display area DA2 may be a kind of component area in which the component 40 is arranged.

The second display area DA2 may be arranged inside the first display area DA1, and surrounded by the first display area DA1 entirely. The second display area DA2 may have a circular shape in a plan view. Alternatively, the second display area DA2 may have an elliptical shape or a polygonal shape such as a quadrangle.

As shown in FIG. 5, the second display area DA2 may be arranged on the upper center of the display area DA in a plan view. According to some embodiments, the second display area DA2 may be arranged at various positions such as on the upper right side or in the intermediate portion of the display area DA, or any other suitable area within the display area DA (e.g., within or surrounded entirely or partially by the first display area DA1) in a plan view.

Figure 6:
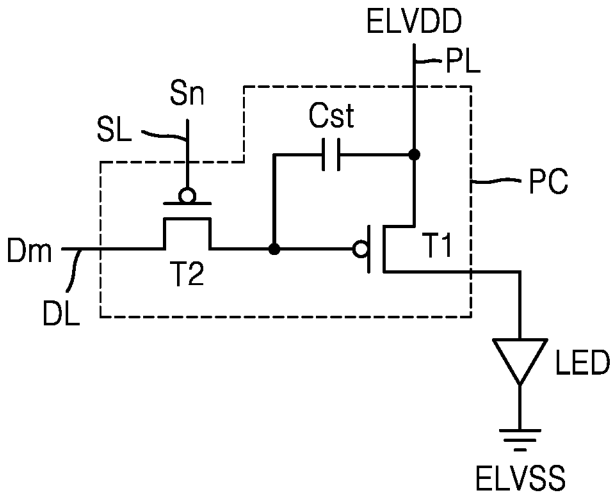
FIG. 6 is a circuit diagram of a sub-pixel circuit connected to each light-emitting diode of the display panel according to some embodiments.

FIG. 6 is a circuit diagram of a sub-pixel circuit connected to each light-emitting diode of the display panel 10 according to some embodiments.

Referring to FIG. 6, the light-emitting diode LED is electrically connected to a sub-pixel circuit PC. The sub-pixel circuit PC may include a first thin-film transistor T1, a second thin-film transistor T2, and a storage capacitor Cst.

The second thin-film transistor T2 is a switching thin-film transistor, may be connected to a scan line SL and a data line DL, and configured to transfer a data voltage (or a data signal Dm) to the first thin-film transistor T1 based on a switching voltage (or a switching signal Sn), the data voltage being input from the data line DL, and the switching voltage being input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor, may be connected to the driving voltage line PL and the storage capacitor Cst, and configured to control a driving current according to the voltage stored in the storage capacitor Cst, the driving current flowing from the driving voltage line PL to an organic light-emitting diode LED. The light-emitting diode LED may emit light having a preset brightness corresponding to the driving current. A second electrode (e.g., a cathode) of the light-emitting diode LED may receive a second power voltage ELVSS.

Though it is illustrated and described with reference to FIG. 6 that the pixel circuit PC includes two thin-film transistors and one storage capacitor, the embodiments according to the present disclosure are not limited thereto. The number of thin-film transistors and the number of storage capacitors may be variously changed according to the design of the sub-pixel circuit PC. As an example, the sub-pixel circuit PC may include three, four, five, or more thin-film transistors. That is, the pixel circuit PC may include additional electronic components, or fewer electronic components, without departing from the spirit and scope of embodiments according to the present disclosure.

Figure 7:
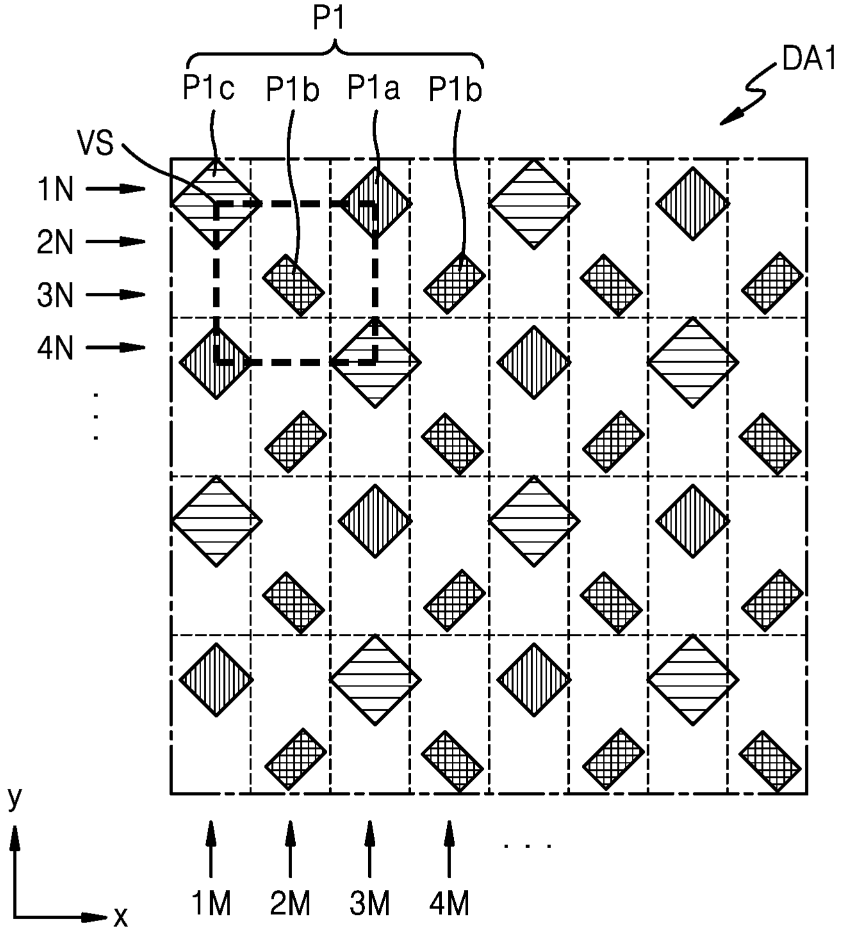
FIG. 7 is a plan view of a portion of a first display area of the display panel according to some embodiments.

FIG. 7 is a plan view of a portion of the first display area DA1 of the display panel 10 according to some embodiments.

Referring to FIG. 7, first sub-pixels P1 may be arranged in the first display area DA1. The first sub-pixels P1 may include a sub-pixel P1*a* configured to emit light of a first color, a sub-pixel P1*b* configured to emit light of a second color, and a sub-pixel P1*c* configured to emit light of a third color. The first color, the second color, and the third color may be different colors. As an example, the first color may be red, the second color may be green, and the third color may be blue.

According to some embodiments, the sub-pixel P1*a* of the first color, the sub-pixel P1*b* of the second color, and the sub-pixel P1*c* of the third color may be arranged in a pentile configuration.

A plurality of sub-pixels P1*a* of the first color and a plurality of sub-pixels P1*c* of the third color are alternately arranged on a first row 1N, a plurality of sub-pixels P1*b* of the second color are arranged at a preset interval on an adjacent second row 2N, and a plurality of sub-pixels P1*c* of the third color and a plurality of sub-pixels P1*a* of the first color are alternately arranged on an adjacent third row 3N, and a plurality of sub-pixels P1*b* of the second color are arranged at a preset interval on an adjacent fourth row 4N. Such a sub-pixel arrangement is repeated to an N-th row. In this case, the size (or the width) of the sub-pixel P1*c* of the third color and the sub-pixel P1*a* of the first color may be greater than the size (or the width) of the sub-pixel P1*b* of the second color.

The plurality of sub-pixels P1*a* of the first color and the plurality of sub-pixels P1*c* of the third color on the first row 1N, and a plurality of sub-pixels P1*b* of the second color on the second row 2N are alternately arranged with each other. Accordingly, a plurality of sub-pixels P1*a* of the first color and a plurality of sub-pixels P1*c* of the third color are alternately arranged on a first column 1M, a plurality of sub-pixels P1*b* of the second color are arranged at a preset interval on an adjacent second column 2M, and a plurality of sub-pixels P1*c* of the third color and a plurality of sub-pixels P1*a* of the first color are alternately arranged on an adjacent third column 3M, and a plurality of sub-pixels P1*b* of the second color are arranged at an interval (e.g., a preset or predetermined interval) on an adjacent fourth column 4M. Such a sub-pixel arrangement is repeated to an M-th column.

Such sub-pixel arrangement structure may be expressed, in which: sub-pixels P1*a* of the first color are respectively arranged on first and third vertexes among the vertexes of a virtual quadrangle VS with a sub-pixel P1*b* of the second color centered in the center of the quadrangle, and sub-pixels P1*c* of the third color are respectively arranged on second and fourth vertexes, which are the rest of the vertexes. In this case, the virtual quadrangle VS may be variously changed to a rectangle, a rhombus, a square, and the like.

This sub-pixel arrangement structure is referred to as a pentile matrix structure or a pentile structure. By applying rendering, in which a color of a sub-pixel is represented by sharing the colors of its adjacent sub-pixels, a high resolution may be obtained via a small number of sub-pixels.

Though it is shown in FIG. 7 that first sub-pixels P1 in the first display area DA1 are arranged in a pentile matrix structure, the embodiments according to the present disclosure are not limited thereto. As an example, the first sub-pixels P1, that is, the sub-pixel P1*a* of the first color, the sub-pixel P1*b* of the second color, and the sub-pixel P1*c* of the third color may be arranged in various configurations such as a stripe structure, a mosaic arrangement structure, and a delta arrangement structure.

Figure 8:
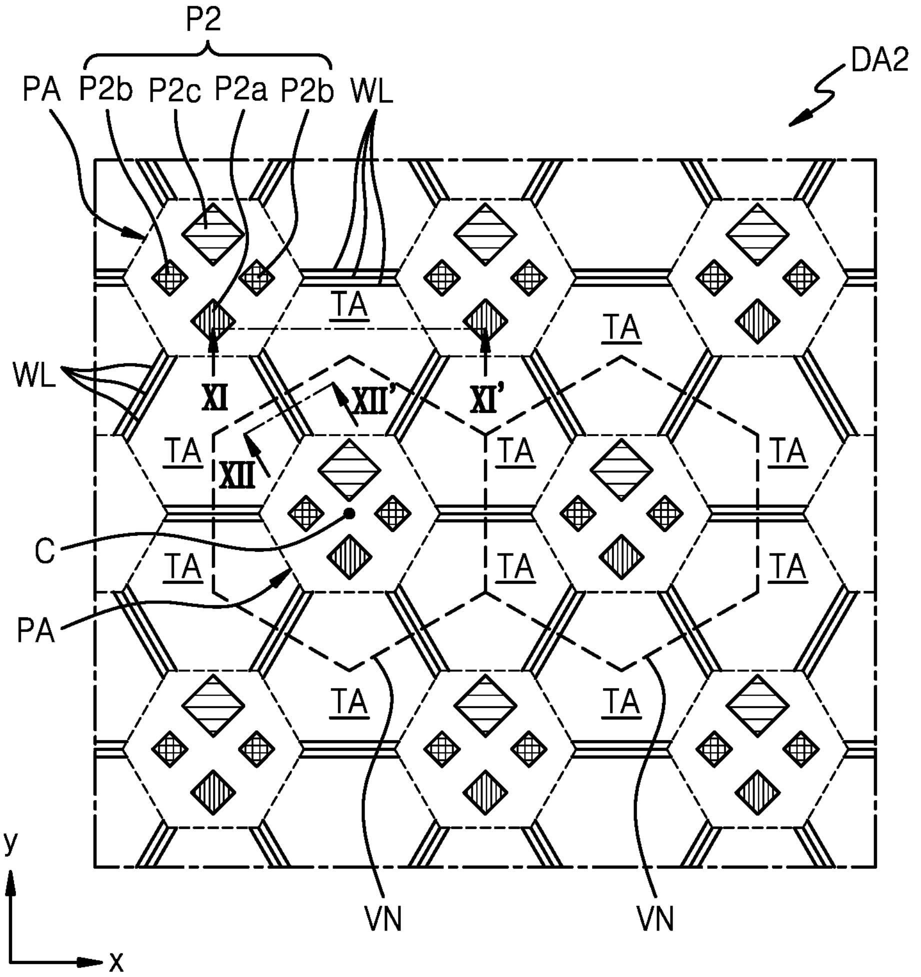
FIGS. 8, 9A, and 9B are plan views of a portion of a second display area of the display panel according to some embodiments.
Figure 9A:
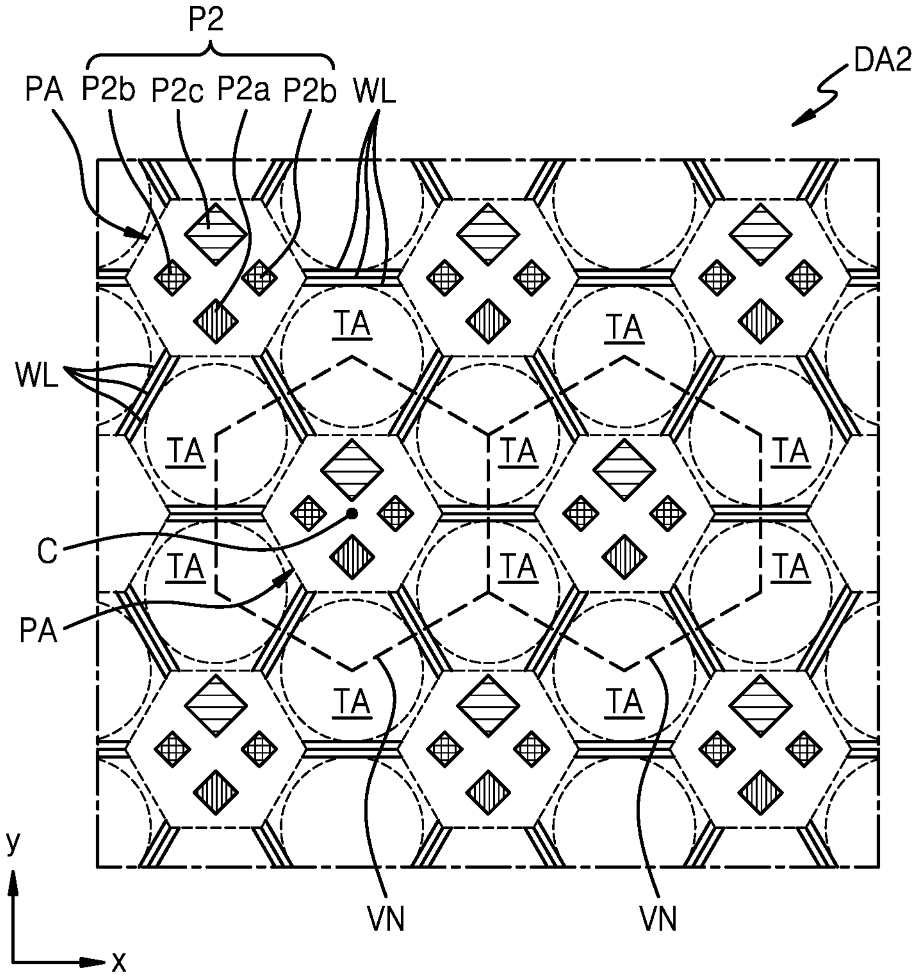
Figure 9B:
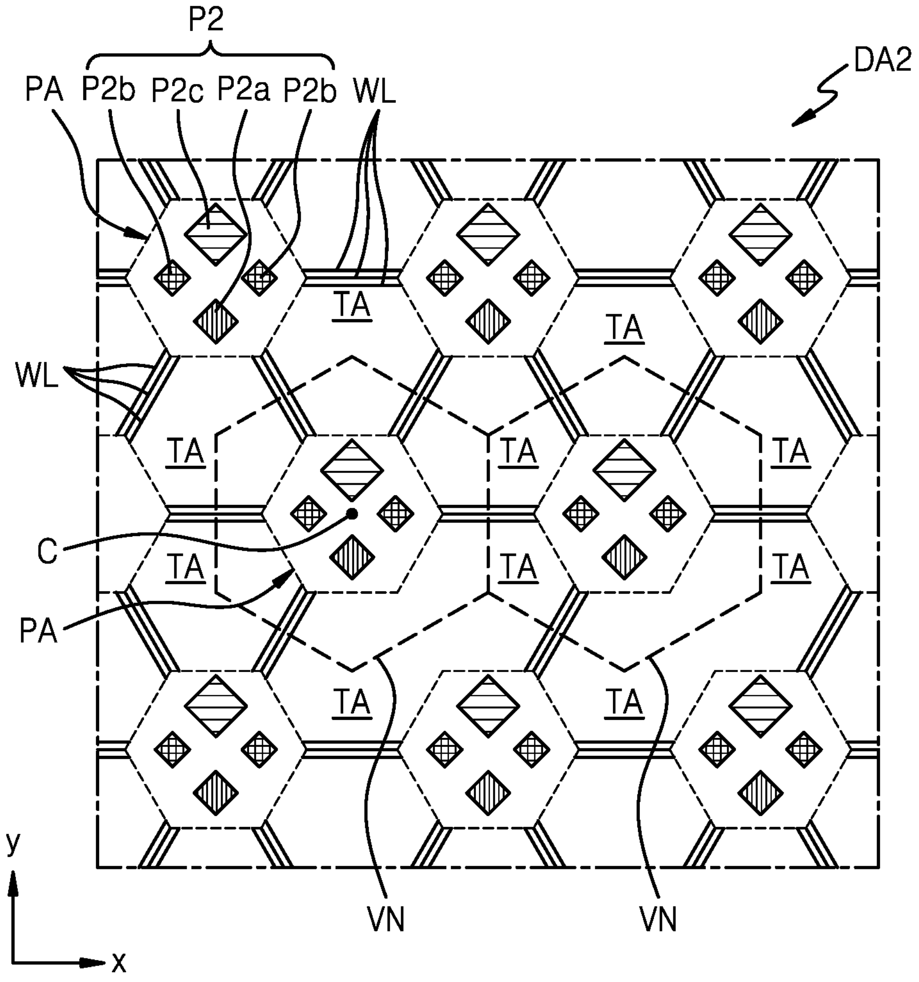

FIGS. 8, 9A, and 9B each are plan views of a portion of the second display area DA2 of the display panel 10, and FIGS. 10A to 10D are plan views of sub-pixels arranged in one of pixel portions provided to the second display area of the display panel 10 according to some embodiments.

Referring to FIGS. 8 and 9A, the second display area DA2 may include a pixel portion (pixel area) PA and a transmissive portion (transmissive area) TA. The pixel portions PA may be apart from each other, and each pixel portion PA may be surrounded by a plurality of transmissive portions TA.

Transmissive portions TA surrounding the pixel portion PA may be located at vertexes of a virtual N-gon (N is an integer that is a multiple of 3) having a center in the pixel portion PA. With regard to this, it is shown in FIGS. 8 and 9 that the transmissive portions TA are located at vertexes of a virtual hexagon VN having a center C in one of the pixel portions PA.

At least one of the pixel portion PA or the transmissive portion TA may have a hexagonal shape. According to some embodiments, as shown in FIG. 8, the pixel portion PA and the transmissive portion TA may each substantially have a hexagonal shape. Alternatively, as shown in FIG. 9A, the transmissive portion TA may have a circular shape. According to some embodiments, the transmissive portion TA may have a polygonal shape such as a triangle, a quadrangle, a pentagon, an octagon, and the like.

A portion of a wiring WL may be arranged between two adjacent transmissive portions TA among the transmissive portions TA surrounding the pixel portion PA. The wiring WL is a conductive line that applies a preset signal or voltage to the sub-pixel circuit electrically connected to a light-emitting diode(s) arranged in each pixel portion PA. As an example, each wiring WL may be one of the scan line SL, the data line DL, and the driving voltage line PL described above with reference to FIG. 4.

A portion of the wiring WL may be arranged between two adjacent transmissive portions TA arranged at the vertexes of the virtual hexagon VN as shown in FIGS. 8 and 9A. Alternatively, a portion of the wiring WL may be arranged between two adjacent transmissive portions TA as shown in FIGS. 9C, and a portion of the wiring WL may not be arranged between two other transmissive portions TA.

At least one sub-pixel may be arranged in each pixel portion PA. According to some embodiments, it is shown in FIGS. 8, 9A, and 9B that the sub-pixel P2*a* of the first color, the sub-pixel P2*b* of the second color, and the sub-pixel P2*c* of the third color are arranged in one pixel portion PA. The first color, the second color, and the third color may be different colors. As an example, the first color may be red, the second color may be green, and the third color may be blue.

The arrangement of the sub-pixels arranged in the pixel portion PA may be the same as or different from the arrangement of the sub-pixels arranged in the first display area DA1 (see FIG. 7) described above with reference to FIG. 7. As an example, as shown in FIGS. 8, 9A, and 9B, the sub-pixel P2*a* of the first color and the sub-pixel P2*c* of the third color may be arranged on the same column, and the sub-pixels P2*b* of the second color may be arranged on two lateral columns of the above-described column.

Figure 10A:
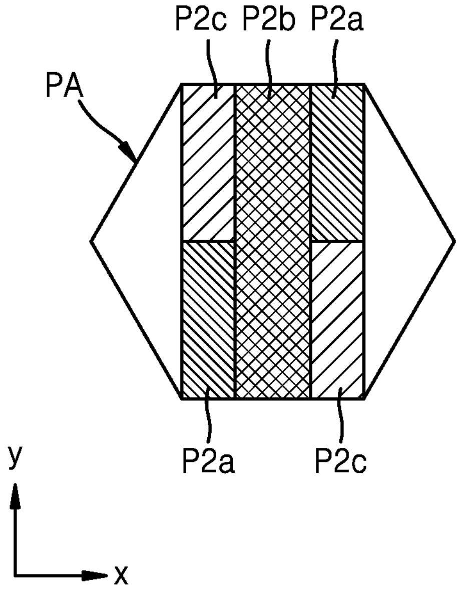
FIGS. 10A to 10D are plan views of sub-pixels arranged in one of pixel portions provided to the second display area of the display panel according to some embodiments.
Figure 10B:
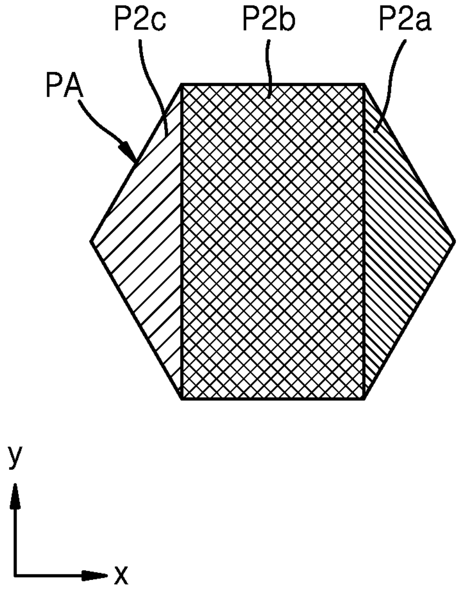
Figure 10C:
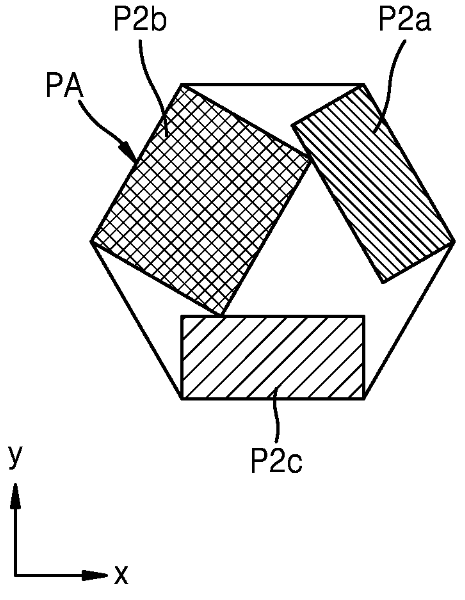
Figure 10D:
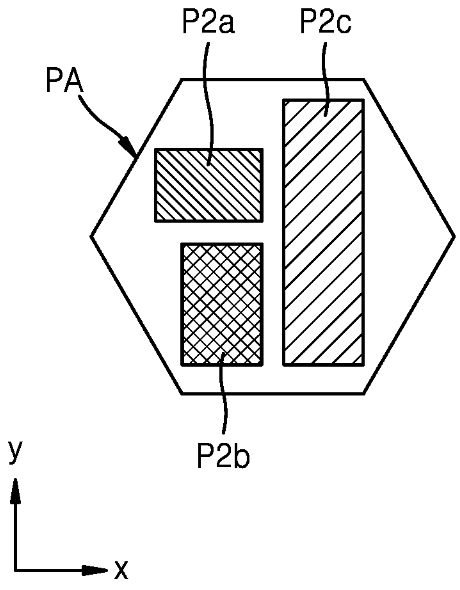

According to some embodiments, as shown in FIGS. 10A to 10D, the sub-pixel P2*a* of the first color, the sub-pixel P2*b* of the second color, and the sub-pixel P2*c* of the third color with different sizes and shapes may be arranged at various positions in each pixel portion PA. As an example, as shown in FIG. 10A, in the pixel portion PA, the sub-pixels P2*a* of the first color may be arranged in a first diagonal direction (e.g., a direction oblique to the x direction and the y direction), and the sub-pixels P2*c* of the third color may be arranged in a second diagonal direction (e.g., a direction oblique to the x direction and the y direction and crossing the first diagonal direction) with the sub-pixel P2*b* of the second color therebetween. As shown in FIG. 10B, the sub-pixel P2*a* of the first color and the sub-pixel P2*c* of the third color may be respectively arranged on two opposite sides with the sub-pixel P2*b* of the second color therebetween. Alternatively, as shown in FIG. 10C, the sub-pixel P2*a* of the first color, the sub-pixel P2*b* of the second color, and the sub-pixel P2*c* of the third color may be respectively arranged on the lateral sides of the pixel portion PA substantially having a hexagonal shape, or as shown in FIG. 10D, the sub-pixel P2*a* of the first color, and the sub-pixel P2*c* of the second color may be arranged on one side of the sub-pixel P2*c* of the third color.

Though it is shown in FIGS. 8, 9A, 9B, and 10A to 10D that the plurality of sub-pixels, for example, the sub-pixel P2*a* of the first color, the sub-pixel P2*b* of the second color, and the sub-pixel P2*c* of the third color are arranged in each pixel portion PA, the embodiments according to the present disclosure are not limited thereto. According to some embodiments, one sub-pixel may be arranged in each sub-pixel PA.

Figure 11:
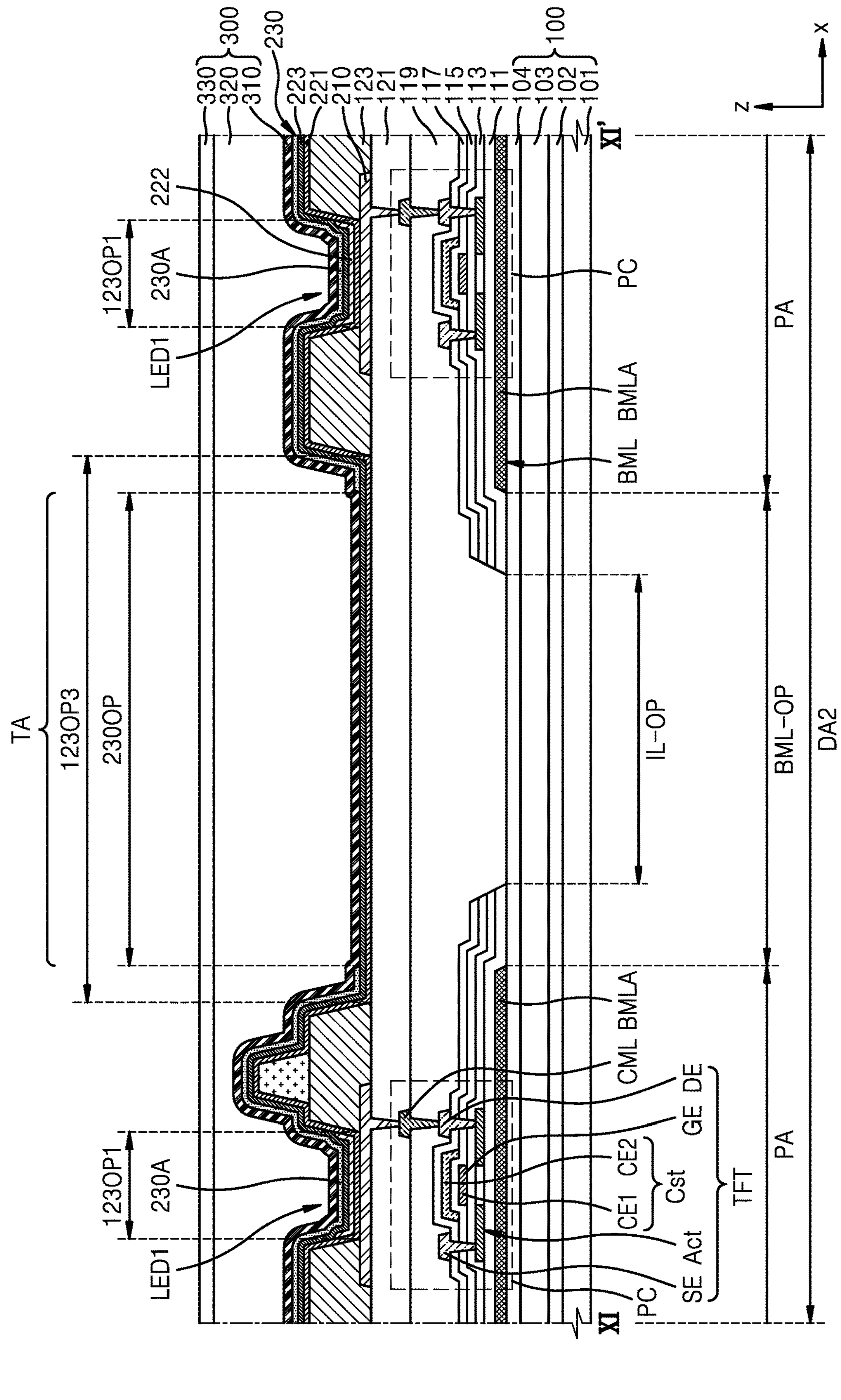
FIG. 11 is a cross-sectional view of the display panel, taken along the line XI-XI' of FIG. 8.

FIG. 11 is a cross-sectional view of the display panel 10, taken along the line XI-XI' of FIG. 8.

Referring to FIGS. 8 and 11, light-emitting diodes are respectively arranged in the pixel portions PA apart from each other with the transmissive portion TA therebetween. With regard to this, FIG. 11 shows first light-emitting diodes LED1 arranged in the respective pixel portions PA. Each of the first light-emitting diodes LED1 may be electrically connected to the sub-pixel circuit PC arranged on the substrate 100.

The substrate 100 may include a first base layer 101, a first barrier layer 102, a second base layer 103, and a second barrier layer 104. The first base layer 101 and the second base layer 103 may each include a polymer resin, and the first barrier layer 102 and the second barrier layer 104 may each include an inorganic insulating material. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate.

The buffer layer 111 is located on the substrate 100. The buffer layer 111 may reduce or block penetration of foreign materials, moisture, or external air from below the substrate 100. The buffer layer 111 may include an inorganic insulating material such as silicon nitride, silicon oxynitride, and silicon oxide, and include a single-layered structure or a multi-layered structure including the above materials.

A metal layer BML may be located between the substrate 100 and the buffer layer 111 and located in the second display area DA2. The metal layer EML may prevent light from influencing an electronic element such as the thin-film transistor TFT of the sub-pixel circuit PC, wherein the light progresses to the component 40 (see FIG. 4) arranged in the second display area DA2, or is emitted from the component 40 (see FIG. 4).

The metal layer BML may include a metal having conductivity such as aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The metal layer BML may be electrically connected to a gate electrode, a source electrode, or a drain electrode of one of transistors included in the sub-pixel circuit described above with reference to FIG. 4. According to some embodiments, the metal layer BML may apply signals or voltages to the sub-pixel circuit, and be electrically connected to a line (e.g., a driving voltage line) electrically connected to the sub-pixel circuit. Alternatively, the metal layer BML may be electrically connected to the wiring WL described below with reference to FIG. 12.

The metal layer BML may include an opening BML-OP and a first portion BMLA, wherein the opening BML-OP corresponds to the transmissive portion TA, and the first portion BMLA corresponds to the pixel portion PA.

The sub-pixel circuit PC may be arranged in the pixel portion PA, and may include the thin-film transistor TFT and the storage capacitor Cst. The thin-film transistor TFT may include a semiconductor layer Act, a gate electrode GE, a source electrode SE, and a drain electrode DE, wherein the gate electrode GE overlaps a channel region of the semiconductor layer Act, and the source electrode SE and the drain electrode DE are respectively connected to a source region and a drain region of the semiconductor layer Act. A gate insulating layer 113 may be located between the semiconductor layer Act and the gate electrode GE, and a first interlayer insulating layer 115 and a second interlayer insulating layer 117 may be located between the gate electrode GE and the source electrode SE, or between the gate electrode GE and the drain electrode DE.

The storage capacitor Cst may overlap the thin-film transistor TFT. The storage capacitor Cst may include a lower electrode CE1 and an upper electrode CE2 overlapping each other. According to some embodiments, the gate electrode GE of the thin-film transistor TFT may include the lower electrode CE1 of the storage capacitor Cst. The first interlayer insulating layer 115 may be located between the lower electrode CE1 and the upper electrode CE2.

The semiconductor layer Act may include polycrystalline silicon. According to some embodiments, the semiconductor layer Act may include amorphous silicon. According to some embodiments, the semiconductor layer Act may include an oxide semiconductor of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer Act may include a channel region, a source region, and a drain region, the source region and the drain region being doped with impurities.

The gate insulating layer 113 may include an inorganic insulating material such as silicon nitride, silicon oxynitride, and silicon oxide, and include a single-layered structure or a multi-layered structure including the above materials.

The gate electrode GE or the lower electrode CE1 may include a conductive material of a low-resistance material such as molybdenum (Mo), aluminum (Al), copper (Cu) and/or titanium (Ti), and have a single-layered structure or a multi-layered structure including the above materials.

The first interlayer insulating layer 115 may include an inorganic insulating material such as silicon nitride, silicon oxynitride, and silicon oxide, and include a single-layered structure or a multi-layered structure including the above materials.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The second interlayer insulating layer 117 may include an inorganic insulating material such as silicon nitride, silicon oxynitride, and silicon oxide, and include a single-layered structure or a multi-layered structure including the above materials.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials. As an example, the source electrode SE and/or the drain electrode DE may each have a three-layered structure of a titanium layer/aluminum layer/titanium layer.

A first organic insulating layer 119 may be located on the thin-film transistor TFT, and the thin-film transistor TFT may be electrically connected to a first electrode 210 of an organic light-emitting diode through a connection electrode layer CML located on the first organic insulating layer 119. The connection electrode layer CML may be connected to the thin-film transistor TFT through a contact hole of the first organic insulating layer 119, and the first electrode 210 may be connected to the connection electrode layer CML through a contact hole of the second organic insulating layer 121.

The first organic insulating layer 119 and/or the second organic insulating layer 121 may each include an organic insulating material such as benzocyclobutene (BCB) or hexamethyldisiloxane (HMDSO). According to some embodiments, the connection electrode layer CML and the second organic insulating layer 121 may be omitted. In this case, the first electrode 210 may be directly connected to the thin-film transistor TFT through a contact hole of the first organic insulating layer 119.

The first light-emitting diode LED1 may have an overlapping structure of the first electrode 210, an emission layer 222, and a second electrode 230. The overlapping structure may include a first functional layer 221 and/or a second functional layer 223, wherein the first functional layer 221 is between the first electrode 210 and the emission layer 222, and the second functional layer is between the emission layer 222 and the second electrode 230.

The first electrode 210 may be located on the second organic insulating layer 121. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The first electrode 210 may include a reflective layer and a transparent conductive layer, wherein the reflective layer includes the above materials, and the transparent conductive layer is located on/under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the first electrode 210 may have a triple-layered structure of ITO layer/Ag layer/ITO layer.

The bank layer 123 may cover the edges of the first electrode 210 and include an opening that overlaps the first electrode 210. With regard to this, FIG. 11 shows an opening 123OP1 (referred to as a first opening) that overlaps the first electrode 210 of the first light-emitting diode LED1.

The first opening 123OP1 of the bank layer 123 may define an emission area of the first light-emitting diode LED1. As an example, the width of the first opening 123OP1 of the bank layer 123 may correspond to the width of the emission area of the first light-emitting diode LED1, and the width of the emission area of the first light-emitting diode LED1 may correspond to the width of the sub-pixel P2*a* (see FIG. 8) of the first color. The bank layer 123 may include a light transmissive material or a light-blocking material.

The bank layer 123 may include a transmissive opening 123OP3 corresponding to the transmissive portion TA. At least one insulating layer, for example, inorganic insulating layers located between the substrate 100 and the bank layer 123 may include an opening that corresponds to the transmissive portion TA. With regard to this, it is shown in FIG. 11 that an inorganic insulating material stack of the buffer layer 111, the gate insulating layer 113, the first interlayer insulating layer 115, and the second interlayer insulating layer 117 includes an opening IL-OP that overlaps the transmissive portion TA.

A spacer 125 may be located on the bank layer 123. The spacer 125 may include a material that is the same as or different from that of the bank layer 123.

The emission layer 222 may be located to correspond to the first opening 123OP1 of the bank layer 123 and may overlap the first electrode 210. The emission layer 222 may include a polymer organic material or a low-molecular weight organic material emitting light having a preset color. The first functional layer 221 and the second functional layer 223 may be respectively formed under and on the emission layer 222.

The first functional layer 221 may include a hole transport layer (HTL) and/or a hole injection layer (HIL). The second functional layer 223 may include an electron transport layer (ETL) and/or an electron injection layer (EIL). Unlike the emission layer 222, the first functional layer 221 and/or the second functional layer 223 may be formed over the substrate 100 entirely. In other words, the first functional layer 221 and/or the second functional layer 223 may cover the first display area DA1 and the second display area DA2.

The second electrode 230 may include a conductive material having a relatively low work function. As an example, the second electrode 230 may include a (semi) transparent layer including silver (Ag), magnesium (Mg), aluminum (Al), nickel (Ni), chromium (Cr), lithium (Li), calcium (Ca) or an alloy thereof. Alternatively, the second electrode 230 may further include a layer on the (semi) transparent layer, the layer including ITO, IZO, ZnO, or $In_2O_3$. According to some embodiments, the second layer 230 may include silver (Ag) and magnesium (Mg).

The second electrode 230 may include a transmissive opening 230OP and a first portion 230A, wherein the opening 230OP corresponds to the transmissive portion TA, and the first portion 230A corresponds to the pixel portion PA. In the case where the second electrode 230 is a (semi) transparent layer including a metal material as described above, the second electrode 230 may improve a transmittance of the transmissive portion TA by including the transmissive opening 230OP that corresponds to the transmissive portion TA.

The encapsulation layer 300 may cover the light-emitting diodes including the first light-emitting diode LED1. According to some embodiments, the encapsulation layer 300 may include the first inorganic encapsulation layer 310, the second inorganic encapsulation layer 330, and the organic encapsulation layer 320 therebetween. The encapsulation layer 300 may cover the pixel portion PA and the transmissive portion TA entirely.

Figure 12:
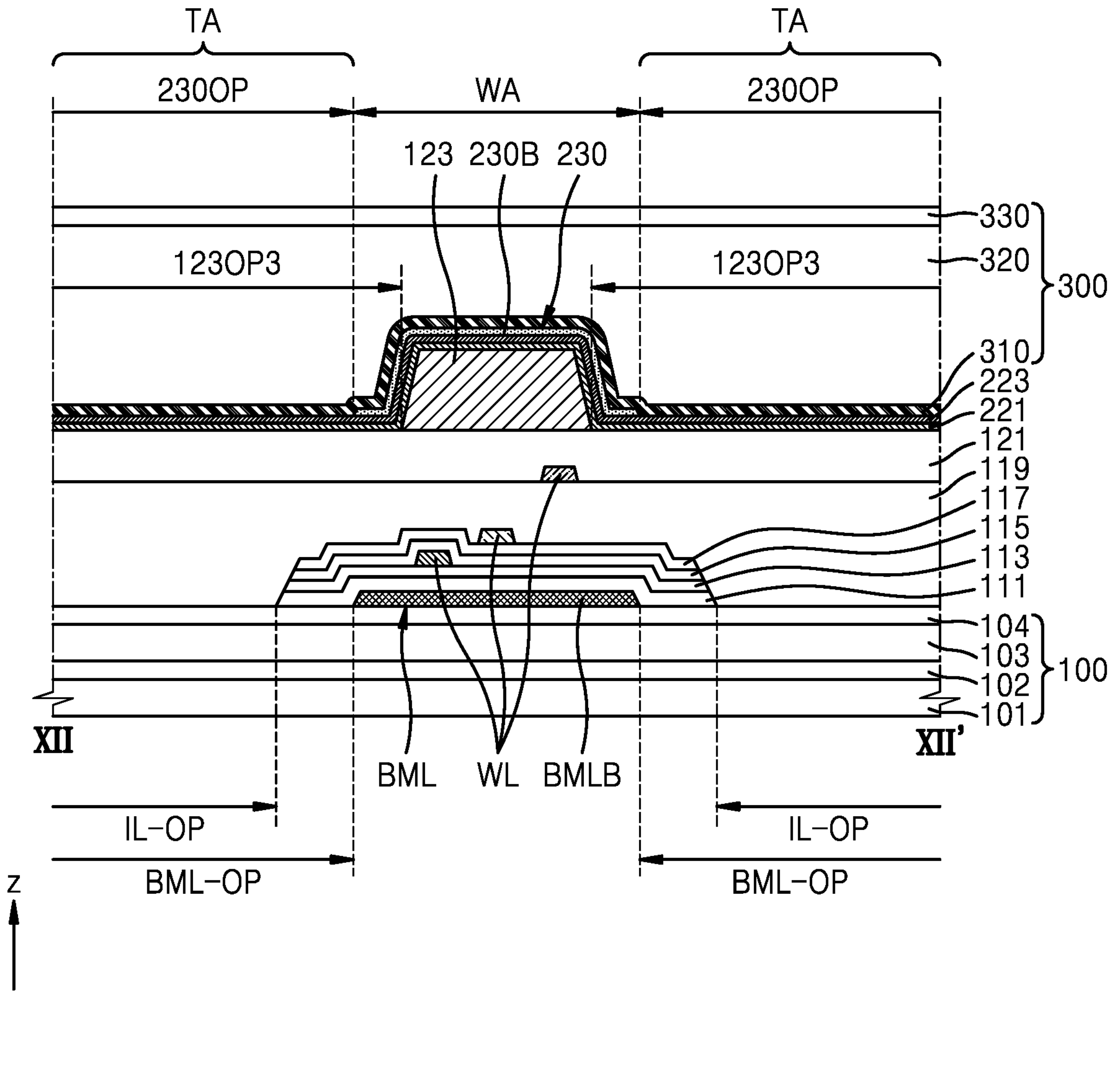
FIG. 12 is a cross-sectional view of the display panel, taken along the line XII-XII' of FIG. 8; A stack structure of FIG. 12 is the same as described with reference to FIG. 11.

FIG. 12 is a cross-sectional view of the display panel 10, taken along the line XII-XII' of FIG. 8. A stack structure of FIG. 12 is the same as described with reference to FIG. 11.

Referring to FIGS. 8 and 12, a portion of the wiring WL may be located between two adjacent transmissive areas TA. The wiring WL may be located on the gate insulating layer 113, the first interlayer insulating layer 115, or the second interlayer insulating layer 117. As described above, like the scan line, the data line, and the driving voltage line, the wiring WL may be a conductive line that applies preset signals or voltages to the sub-pixel circuit PC (see FIG. 11).

Some of the wirings WL may be located in a wiring area WA between two adjacent transmissive areas TA. Some of the wirings WL may overlap a portion of the metal layer BML, a portion of the bank layer 123, and a portion of the second electrode layer 230. As an example, a portion of the bank layer 123 located between the openings 123OP corresponding to two adjacent transmissive areas TA may overlap a portion of the wiring WL located in the wiring area WA that is between the two adjacent transmissive areas TA. Similarly, the second electrode 230 may include transmissive openings 230OP corresponding to two adjacent transmissive areas TA, and a portion (e.g., a second portion 230B of the second electrode 230) of the second electrode 230 between the transmissive openings 230OP may overlap a portion of the wiring WL located between the two adjacent transmissive areas TA.

The metal layer BML includes openings BML-OP corresponding to two adjacent transmissive areas TA, and a portion (e.g., a second portion BMLB of the metal layer BML) of the metal layer BML between the openings BML-OP may overlap a portion of the wiring WL located between the two adjacent transmissive areas TA.

Figure 13:
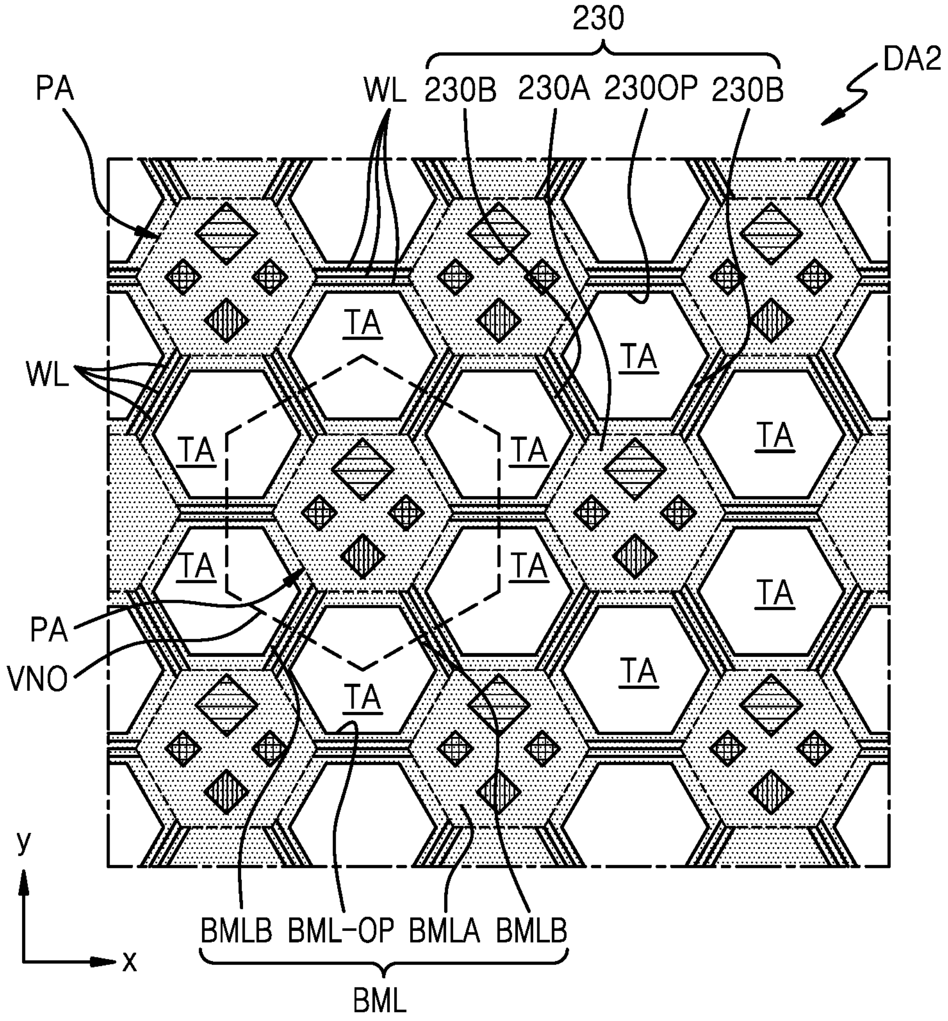
FIG. 13 is a schematic plan view of a structure of a second electrode and a metal layer arranged in the second display area of the display panel according to some embodiments.

FIG. 13 is a schematic plan view of a structure of the second electrode 230 and the metal layer BML arranged in the second display area DA2 of the display panel 10 according to some embodiments.

Referring to FIG. 13, the second electrode 230 is located in the second display area DA2, and may include the transmissive openings 230OP that overlap the transmissive portion TA as described above with reference to FIGS. 11 and 12.

In a plan view, the second electrode 230 may include the first portion 230A, the transmissive openings 230OP, and the second portion 230B, wherein the first portion 230A corresponds to the pixel portion PA, the transmissive openings 230OP surround the first portion 230A, and the second portion 230B is between adjacent transmissive openings 230OP.

Each of the second portions 230B of the second electrode 230 may be integrally connected with the first portion 230A, and may extend in a direction away from the first portion 230A. The second portions 230B of the second electrode 230 may each be located between two adjacent transmissive portions TA. The transmissive openings 230OP of the second electrode 230 may be located at vertexes of a virtual hexagon VNO centered in the first portion 230A.

Similar to the second electrode 230, the metal layer BML may be located in the second display area DA2 and may include openings BML-OP that overlap the transmissive portion TA.

The metal layer BML may include a first portion BMLA, openings BML-OP, and a second portion BMLB, wherein the first portion BMLA corresponds to the pixel portion PA, the openings BML-OP are arranged to surround the first portion BMLA, and the second portion BMLB is between adjacent openings BML-OP. Each of the second portions BMLB of the metal layer BML may be integrally connected with the first portion BMLA, and may extend in a direction away from the first portion BMLA. The second portions BMLB of the metal layer BML may each be located between two adjacent transmissive portions TA. The openings BML-OP of the metal layer BML may be located at vertexes of a virtual hexagon VNO centered in the first portion BMLA.

The transmissive opening 230OP of the second electrode 230 may overlap the opening BML-OP of the metal layer BML to improve a transmittance of the transmissive portion TA. According to some embodiments, as shown in FIG. 13, the transmissive opening 230OP of the second electrode 230 and the opening BML-OP of the metal layer BML may have the same size (or the same area). According to some embodiments, the transmissive opening 230OP of the second electrode 230 may have a greater size (or area) than that of the opening BML-OP of the metal layer BML. According to some embodiments, the transmissive opening 230OP of the second electrode 230 may have a smaller size (or area) than that of the opening BML-OP of the metal layer BML.

Figure 14:
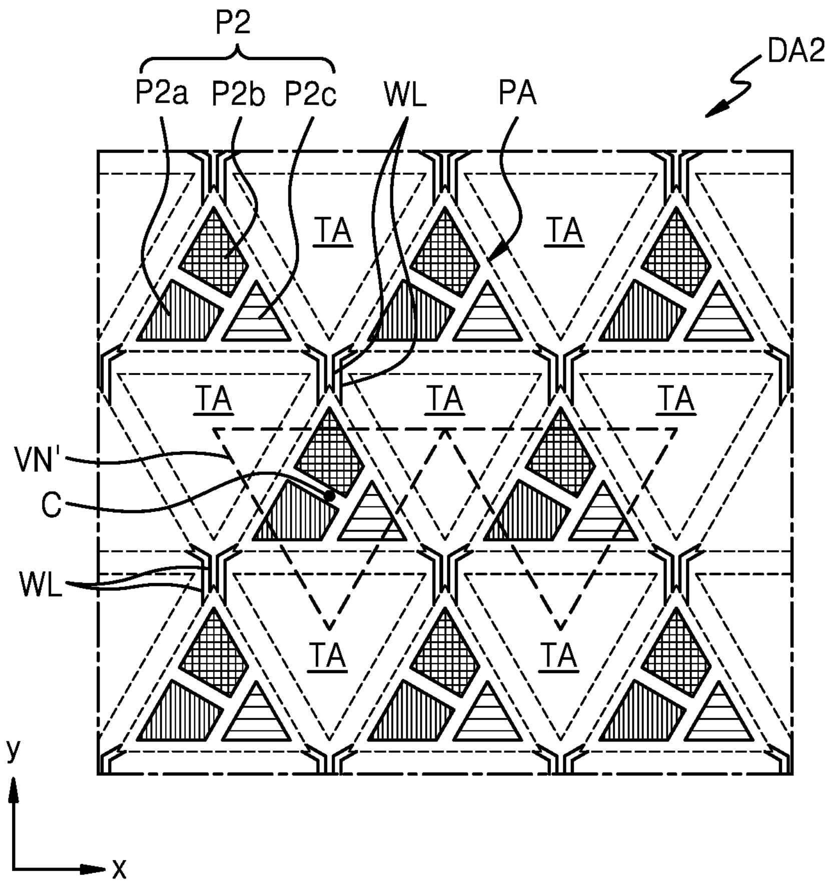
FIG. 14 is a plan view of a portion of a second display area of the display panel according to some embodiments.

FIG. 14 is a plan view of a portion of the second display area DA2 of the display panel 10 according to some embodiments.

Referring to FIG. 14, the second display area DA2 may include the pixel portion PA and the transmissive portion TA. The pixel portions PA may be apart from each other, and a plurality of transmissive portions TA may be arranged around each pixel portion PA.

The transmissive portions PA may be located at vertexes of a virtual N-gon (N is an integer multiple of 3) centered in the pixel portion PA. With regard to this, it is shown in FIG. 14 that the transmissive portions TA are located at vertexes of a virtual triangle VN' having a center C in one of the pixel portions PA.

At least one of the pixel portion PA or the transmissive portion TA may substantially have a triangular shape. According to some embodiments, as shown in FIG. 8, the pixel portion PA and the transmissive portion TA may each substantially have a triangular shape.

A portion of a wiring WL may be arranged between two adjacent transmissive portions TA among the transmissive portions TA arranged around the pixel portion PA. The wiring WL is a conductive line that applies a preset signal or voltage to the sub-pixel circuit electrically connected to a light-emitting diode(s) arranged in each pixel portion PA. As an example, each wiring WL may be one of the scan line SL, the data line DL, and the driving voltage line PL described above with reference to FIG. 4.

At least one sub-pixel may be arranged in each pixel portion PA. According to some embodiments, it is shown in FIG. 14 that the sub-pixel P2*a* of the first color, the sub-pixel P2*b* of the second color, and the sub-pixel P2*c* of the third color are arranged in one pixel portion PA. The first color, the second color, and the third color may be different colors. As an example, the first color may be red, the second color may be green, and the third color may be blue. According to some embodiments, a sub-pixel among the sub-pixel P2*a* of the first color, the sub-pixel P2*b* of the second color, and the sub-pixel P2*c* of the third color may be arranged in each pixel portion PA.

The display panel having the planar structure shown in FIG. 14 may have a cross-sectional structure shown in FIGS. 11 and 12. In addition, as shown in FIG. 15, the second electrode of the light-emitting diode and the metal layer may each have an opening.

Figure 15:
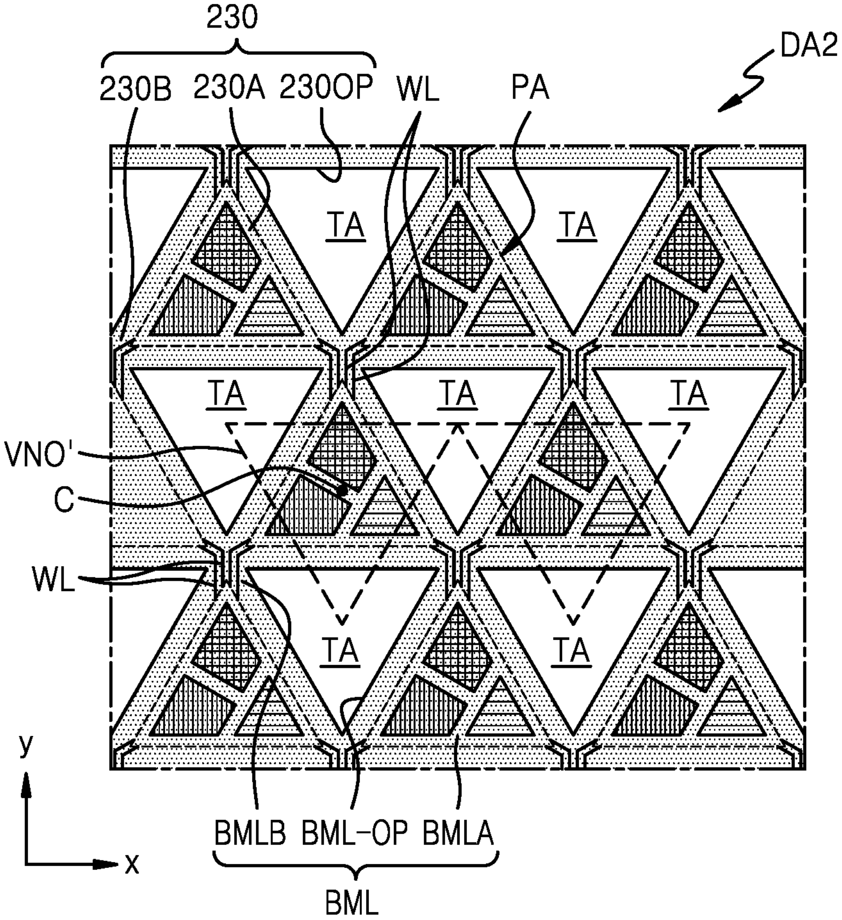
FIG. 15 is a schematic plan view of a structure of a second electrode and a metal layer arranged in the second display area of the display panel according to some embodiments.

FIG. 15 is a schematic plan view of a structure of the second electrode 230 and a metal layer arranged in the second display area DA2 of the display panel 10 according to some embodiments.

Referring to FIG. 15, the second electrode 230 may be located in the second display area DA2, and may include the transmissive openings 230OP that overlap the transmissive portion TA.

In a plan view, the second electrode 230 may include the first portion 230A, the transmissive openings 230OP, and the second portion 230B, wherein the first portion 230A corresponds to the pixel portion PA, the transmissive openings 230OP are arranged around the first portion 230A, and the second portion 230B is between adjacent transmissive openings 230OP. Each of the second portions 230B may be integrally connected with the first portion 230A, and may extend in a direction away from the first portion 230A. The second portions 230B may each be located between two adjacent transmissive portions TA. The transmissive openings 230OP of the second electrode 230 may be located at vertexes of a virtual triangle VNO' having a center C in the first portion 230A.

Similar to the second electrode 230, the metal layer BML may cover the second display area DA2 entirely and include openings BML-OP that overlap the transmissive portion TA.

The metal layer BML may include a first portion BMLA and openings BML-OP, wherein the first portion BMLA corresponds to the pixel portion PA, and the openings BML-OP are arranged to surround the first portion BMLA. The metal layer BML may include a second portion BMLB between adjacent openings BML-OP. Each of the second portions BMLB may be integrally connected with the first portion BMLA, and may extend in a direction away from the first portion BMLA. The second portions BMLB may each be located between two adjacent transmissive portions TA. The openings BML-OP of the metal layer BML may be located at vertexes of a virtual triangle VNO' centered in the first portion BMLA.

The transmissive opening 230OP of the second electrode 230 may overlap the opening BML-OP of the metal layer BML. According to some embodiments, as shown in FIG. 15, the transmissive opening 230OP of the second electrode 230 and the opening BML-OP of the metal layer BML may have the same size (or the same area). According to some embodiments, the transmissive opening 230OP of the second electrode 230 may have a greater size (or area) than that of the opening BML-OP of the metal layer BML. According to some embodiments, the transmissive opening 230OP of the second electrode 230 may have a smaller size (or area) than that of the opening BML-OP of the metal layer BML.

Aspects of some embodiments may include a display panel that may display high-quality images, and prevent or reduce diffraction of light received by a component located in a display area of the display panel. However, this effect is an example, and embodiments according to the disclosure is not limited thereto.

It should be understood that embodiments described herein should be considered in a descriptive sense only and not for purposes of limitation. Descriptions of features or aspects within each embodiment may be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:

a first display area having a plurality of sub-pixels; and a second display area adjacent to the first display area, wherein the second display area comprises:

a pixel portion including at least one sub-pixel;

a plurality of transmissive portions surrounding the pixel portion in a plan view, wherein a sub-pixel circuit including transistors is in the second display area, the transistors being electrically connected to light-emitting diodes that correspond to the at least one sub-pixel, and wherein a portion of a wiring is between two adjacent transmissive portions among the plurality of transmissive portions, the wiring being electrically connected to the sub-pixel circuit; and a metal layer below the sub-pixel circuit, wherein the metal layer includes a plurality of openings respectively corresponding to the plurality of transmissive portions, and wherein the metal layer is electrically connected to the wiring, a gate electrode of one of the transistors included in the sub-pixel circuit, or a line, wherein the line is electrically connected to the sub-pixel circuit to apply a signal or a voltage to the sub-pixel circuit.

2. The display panel of claim 1, wherein the wiring includes a data line, a scan line, or a driving voltage line electrically connected to the sub-pixel circuit.

3. The display panel of claim 1, wherein each of at least one of the plurality of transmissive portions, or the pixel portion has a hexagonal shape in a plan view.

4. The display panel of claim 1, further comprising:

a first electrode in the pixel portion in the second display area;

an emission layer on the first electrode; and a second electrode on the emission layer, wherein the second electrode includes a plurality of transmissive openings respectively corresponding to the plurality of transmissive portions.

5. The display panel of claim 4, wherein the second electrode includes:

a first portion overlapping the pixel portion; and second portions formed as one body with the first portion and extending in a direction away from the first portion, wherein one of the second portions is between two transmissive openings among the plurality of transmissive openings.

6. The display panel of claim 5, wherein the plurality of transmissive openings of the second electrode are at vertexes of a virtual hexagon centered in the first portion.

7. The display panel of claim 1, wherein the metal layer includes:

a first portion overlapping the pixel portion; and second portions formed as one body with the first portion and extending in a direction away from the first portion, wherein a portion of the wiring overlaps one of the second portions of the metal layer.

8. An electronic apparatus comprising:

a display panel including a first display area having a plurality of sub-pixels, and a second display area adjacent to the first display area; and a component below the display panel and corresponding to the second display area, wherein the second display area of the display panel includes:

a pixel portion including at least one sub-pixel;

a plurality of transmissive portions located at vertexes of a virtual polygon having N sides, where N is a multiple of 3, centered located in the pixel portion in a plan view, wherein the at least one sub-pixel is configured to emit light from a light-emitting diode electrically connected to a sub-pixel circuit including transistors of the at least one sub-pixel, and wherein a portion of a wiring electrically connected to the sub-pixel circuit is between two transmissive portions among the plurality of transmissive portions; and a metal layer below the sub-pixel circuit, wherein the metal layer includes a plurality of openings respectively corresponding to the plurality of transmissive portions, and wherein the metal layer is electrically connected to the wiring, a gate electrode of one of the transistors included in the sub-pixel circuit, or a line, wherein the line is electrically connected to the sub-pixel circuit to apply a signal or a voltage to the sub-pixel circuit.

9. The electronic apparatus of claim 8, wherein the wiring includes a data line, a scan line, or a driving voltage line electrically connected to the sub-pixel circuit.

10. The electronic apparatus of claim 8, further comprising a first electrode in the pixel portion in the second display area;

an emission layer on the first electrode; and a second electrode on the emission layer, wherein the second electrode includes a plurality of transmissive openings respectively corresponding to the plurality of transmissive portions.

11. The electronic apparatus of claim 10, wherein the second electrode includes:

a first portion overlapping the pixel portion; and second portions formed as one body with the first portion and extending in a radial direction away from a center of the first portion, wherein one of the second portions is located two adjacent transmissive openings among the plurality of transmissive openings.

12. The electronic apparatus of claim 11, wherein a center of each of the plurality of transmissive openings of the second electrode is in a vertex of a virtual hexagon centered in the first portion.

13. The electronic apparatus of claim 11, wherein a center of each of the plurality of transmissive openings of the second electrode is in a vertex of a virtual triangle centered in the first portion.

14. The electronic apparatus of claim 11, wherein a portion of the wiring overlaps one of the second portions of the second electrode.

15. The electronic apparatus of claim 8, wherein the metal layer comprises:

a first portion overlapping the pixel portion; and second portions formed as one body with the first portion and extending in a direction away from the first portion, wherein a portion of the wiring overlaps one of the second portions of the metal layer.

16. The electronic apparatus of claim 8, wherein the component includes a sensor or a camera.

* * * * *